(12) United States Patent
Song et al.

(10) Patent No.: US 12,027,523 B2
(45) Date of Patent: Jul. 2, 2024

(54) SEMICONDUCTOR DEVICE INCLUDING A FIELD EFFECT TRANSISTOR AND METHOD OF FABRICATING THE SAME

(71) Applicant: Samsung Electronics Co., Ltd., Suwon-si (KR)

(72) Inventors: Inhyun Song, Suwon-si (KR); Junggil Yang, Hwaseong-si (KR); Minju Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 407 days.

(21) Appl. No.: 17/468,139

(22) Filed: Sep. 7, 2021

(65) Prior Publication Data
US 2022/0254781 A1    Aug. 11, 2022

(30) Foreign Application Priority Data
Feb. 10, 2021   (KR) .......................... 10-2021-0018999

(51) Int. Cl.
*H01L 21/8238*    (2006.01)
*H01L 27/092*    (2006.01)
(Continued)

(52) U.S. Cl.
CPC .... *H01L 27/092* (2013.01); *H01L 21/823821* (2013.01); *H01L 21/823828* (2013.01); *H01L 21/823842* (2013.01); *H01L 21/82385* (2013.01); *H01L 27/0924* (2013.01); *H01L 29/42392* (2013.01); *H01L 29/4908* (2013.01);
(Continued)

(58) Field of Classification Search
CPC ....... H01L 29/42392; H01L 21/823821; H01L 27/0924; H01L 21/28088; H01L 21/823842; H01L 29/4966; H01L 29/4975
See application file for complete search history.

(56) References Cited

U.S. PATENT DOCUMENTS 10,103,065 B1   10/2018  Mochizuki et al.
10,388,577 B1    8/2019  Cheng et al.
(Continued)

FOREIGN PATENT DOCUMENTS

KR    1020180080527 A    7/2018

*Primary Examiner* — Nicholas J Tobergte
*Assistant Examiner* — William Henry Anderson
(74) *Attorney, Agent, or Firm* — Muir Patent Law, PLLC

(57) ABSTRACT

Disclosed are semiconductor devices and their fabricating methods. The semiconductor device comprises first and second active patterns, a first channel pattern including first semiconductor patterns, a second channel pattern including second semiconductor patterns, a gate electrode on the first and second channel patterns, and a gate dielectric layer between the gate electrode and the first and second channel patterns. The gate electrode includes a first inner gate electrode between the first semiconductor patterns, a second inner gate electrode between the second semiconductor patterns, and an outer gate electrode outside the first and second semiconductor patterns. The first and second inner gate electrodes are on bottom surfaces of uppermost first and second semiconductor patterns. The outer gate electrode is on top surfaces and sidewalls of the uppermost first and second semiconductor patterns. The first and second inner gate electrodes have different work functions.

18 Claims, 40 Drawing Sheets

(51) Int. Cl.
  *H01L 29/423*    (2006.01)
  *H01L 29/49*     (2006.01)
  H01L 21/28       (2006.01)
  H01L 29/786      (2006.01)

(52) U.S. Cl.
  CPC .. *H01L 21/28088* (2013.01); *H01L 29/78696* (2013.01)

(56) References Cited

U.S. PATENT DOCUMENTS

| | | |
|---|---|---|
| 10,490,559 B1 | 11/2019 | Ando et al. |
| 10,566,245 B2 | 2/2020 | Kwon et al. |
| 10,615,257 B2 | 4/2020 | Ok et al. |
| 10,937,704 B1* | 3/2021 | Chiang ............ H01L 21/823821 |
| 2018/0190829 A1 | 7/2018 | Song et al. |
| 2019/0371933 A1* | 12/2019 | Chen ................. H01L 29/41791 |
| 2020/0035678 A1* | 1/2020 | Lee .................. H01L 21/823842 |
| 2020/0043808 A1* | 2/2020 | Bao .................. H01L 21/28088 |
| 2020/0105758 A1* | 4/2020 | Ching .................. H01L 27/092 |
| 2020/0294863 A1 | 9/2020 | Chiang et al. |
| 2020/0294866 A1 | 9/2020 | Cheng et al. |
| 2021/0376104 A1* | 12/2021 | More ................ H01L 29/66795 |
| 2022/0359513 A1* | 11/2022 | Yu ...................... H01L 27/0207 |

* cited by examiner

SEMICONDUCTOR DEVICE INCLUDING A FIELD EFFECT TRANSISTOR AND METHOD OF FABRICATING THE SAME

CROSS-REFERENCE TO RELATED APPLICATION

This U.S. nonprovisional application claims priority under 35 U.S.C § 119 to Korean Patent Application No. 10-2021-0018999, filed on Feb. 10, 2021, in the Korean Intellectual Property Office, the disclosure of which is hereby incorporated by reference in its entirety.

BACKGROUND

The present inventive concepts relate to a semiconductor device and a method of fabricating the same, and more particularly, to a semiconductor device including a field effect transistor and a method of fabricating the same.

A semiconductor device includes an integrated circuit including metal oxide semiconductor field effect transistors (MOSFETs). As sizes and design rules of the semiconductor device are gradually decreased, sizes of the MOSFETs are also increasingly scaled down. The scale down of MOSFETs may deteriorate operating characteristics of the semiconductor device. Accordingly, various studies have been conducted to develop methods of fabricating semiconductor devices having superior performances while overcoming limitations caused by high integration of the semiconductor devices.

SUMMARY

Some embodiments of the present inventive concepts provide a semiconductor device having increased reliability and improved electrical characteristics.

Some embodiments of the present inventive concepts provide a method of fabricating a semiconductor device having increased reliability and improved electrical characteristics.

According to some embodiments of the present inventive concepts, a semiconductor device may comprise: a first active pattern and a second active pattern respectively on a PMOSFET region and an NMOSFET region of a substrate; a first channel pattern on the first active pattern, the first channel pattern including a plurality of first semiconductor patterns that are stacked and spaced apart from each other in a vertical direction perpendicular to a top surface of the substrate; a second channel pattern on the second active pattern, the second channel pattern including a plurality of second semiconductor patterns that are stacked and spaced apart from each other the vertical direction; a gate electrode on the first and second channel patterns, the gate electrode extending lengthwise in a first direction parallel to the top surface of the substrate; and a gate dielectric layer between the gate electrode and the first and second channel patterns. The gate electrode may include: a first inner gate electrode that fills a first inner area between first semiconductor patterns of the plurality of first semiconductor patterns that are adjacent to each other; a second inner gate electrode that fills a second inner area between second semiconductor patterns of the plurality of second semiconductor patterns that are adjacent to each other; and an outer gate electrode that fills an outer area outside the first and second semiconductor patterns. The first inner gate electrode may be on a bottom surface of an uppermost one of the first semiconductor patterns. The outer gate electrode may be on a top surface and opposite sidewalls of the uppermost one of the first semiconductor patterns. The second inner gate electrode may be on a bottom surface of an uppermost one of the second semiconductor patterns. The outer gate electrode may be on a top surface and opposite sidewalls of the uppermost one of the second semiconductor patterns. A work function of the first inner gate electrode may be different from a work function of the second inner gate electrode.

According to some embodiments of the present inventive concepts, a semiconductor device may comprise: a substrate; a device isolation layer on the substrate, the device isolation layer defining an active pattern; a fin structure on the active pattern, the fin structure including a plurality of inner gate electrodes and a plurality of semiconductor patterns that are alternately stacked on the active pattern, the fin structure vertically protruding upwardly from the device isolation layer; and an outer gate electrode on the fin structure. The outer gate electrode may be on a top surface and opposite sidewalls of an uppermost one of the semiconductor patterns. An uppermost one of the inner gate electrodes may be on a bottom surface of the uppermost one of the semiconductor patterns. A first sidewall and a second sidewall of the uppermost one of the inner gate electrodes may be in contact with the outer gate electrode. The first and second sidewalls may be opposite to each other. The uppermost one of the inner gate electrodes may include at least one impurity selected from silicon (Si), aluminum (Al), carbon (C), and nitrogen (N). An impurity concentration in the uppermost one of the inner gate electrodes may decrease and then increase in a direction extending from the first sidewall to the second sidewall.

According to some embodiments of the present inventive concepts, a semiconductor device may comprise: a first active pattern and a second active pattern respectively on a PMOSFET region and an NMOSFET region of a substrate; a device isolation layer that fills a trench between the first and second active patterns; a first fin structure on the first active pattern, the first fin structure including a plurality of first inner gate electrodes and a plurality of first semiconductor patterns that are alternately stacked on the first active pattern; a second fin structure on the second active pattern, the second fin structure including a plurality of second inner gate electrodes and a plurality of second semiconductor patterns that are alternately stacked on the second active pattern; a gate dielectric layer that surrounds each of the first and second semiconductor patterns; an outer gate electrode that covers the first and second fin structures and extends lengthwise in a first direction parallel to a top surface of the substrate; a gate capping pattern on a top surface of the outer gate electrode; a first interlayer dielectric layer on the gate capping pattern; a gate contact that penetrates the first interlayer dielectric layer and is coupled to the outer gate electrode; a second interlayer dielectric layer on the first interlayer dielectric layer; a first metal layer in the second interlayer dielectric layer, the first metal layer including a first line electrically connected to the gate contact; a third interlayer dielectric layer on the second interlayer dielectric layer; and a second metal layer in the third interlayer dielectric layer. The second metal layer may include a second line electrically connected to the first line. An uppermost one of the first inner gate electrodes may be on a bottom surface of an uppermost one of the first semiconductor patterns. The outer gate electrode may be on a top surface and opposite sidewalls of the uppermost one of the first semiconductor patterns. An uppermost one of the second inner gate electrodes may be on a bottom surface of an uppermost one of the second semiconductor patterns. The outer gate electrode may be on a top surface and opposite sidewalls of the uppermost one of the second semiconductor patterns. A work function of the first inner gate electrode may be different from a work function of the second inner gate electrode.

According to some embodiments of the present inventive concepts, a method of fabricating a semiconductor device may comprise: forming a stack pattern on an active pattern of a substrate, the stack pattern including a plurality of sacrificial layers and a plurality of semiconductor patterns that are alternately stacked on the active pattern; forming on the stack pattern a sacrificial pattern that extends lengthwise in a first direction; forming an interlayer dielectric layer on the sacrificial pattern; selectively removing the sacrificial pattern to form an outer area that exposes the stack pattern; selectively removing the sacrificial layers of the exposed stack pattern to form a plurality of inner areas between the semiconductor patterns; forming a metal layer on the semiconductor patterns; etching the metal layer to form a plurality of inner gate electrodes that fill corresponding inner areas, wherein etching the metal layer is performed until a top surface and opposite sidewalls of an uppermost one of the semiconductor patterns are exposed; and forming an outer gate electrode on the semiconductor patterns and the inner gate electrodes.

DETAILED DESCRIPTION OF EMBODIMENTS

Exemplary embodiments of the inventive concept will be more clearly understood from the following detailed description taken in conjunction with the accompanying drawings in which like numerals refer to like elements throughout.

Figure 1:
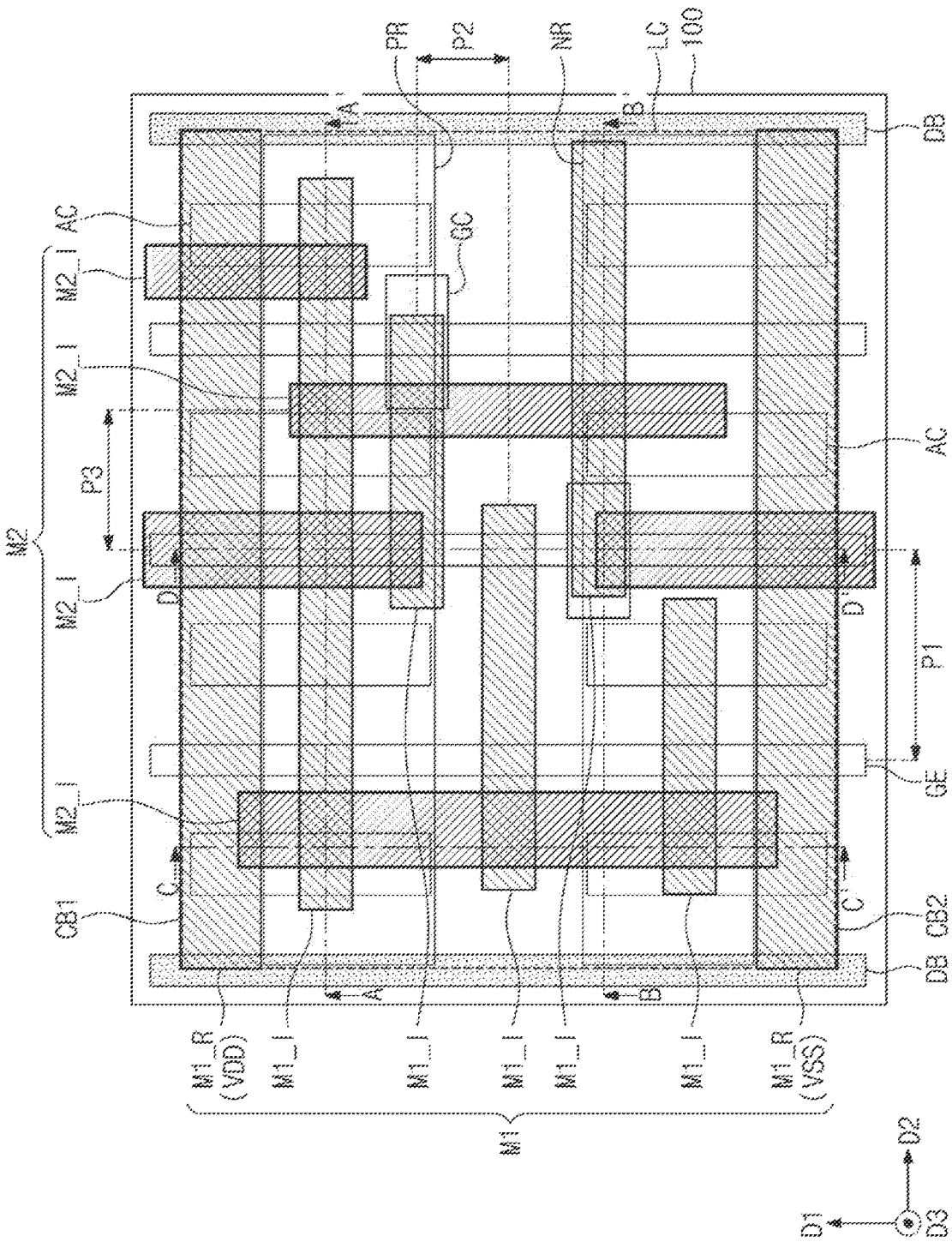
FIG. 1 illustrates a plan view showing a semiconductor device, according to example embodiments of the present inventive concepts.

FIG. 1 illustrates a plan view showing a semiconductor device according to example embodiments of the present inventive concepts. FIGS. 2A, 2B, 2C, and 2D illustrate cross-sectional views respectively taken along lines A-A', B-B', C-C', and D-D' of FIG. 1. FIG. 3A illustrates an enlarged cross-sectional view showing section M of FIG. 2D. FIG. 3B illustrates an enlarged cross-sectional view showing section N of FIG. 2D.

Referring to FIGS. 1 and 2A to 2D, a logic cell LC may be provided on a substrate 100. The logic cell LC may include logic transistors that constitute a logic circuit. The substrate 100 may be a compound semiconductor substrate or a semiconductor substrate including silicon, germanium, or silicon-germanium. For example, the substrate 100 may be a silicon substrate. The logic cell LC may include a p-type metal oxide semiconductor field effect transistor (PMOSFET) region PR and an n-type metal oxide semiconductor field effect transistor (NMOSFET) region NR. The PMOSFET region PR and the NMOSFET region NR may be spaced apart from each other in a first direction D1.

A first active pattern AP1 and a second active pattern AP2 may be defined by a trench TR formed on an upper portion of the substrate 100. The first active pattern AP1 and the second active pattern AP2 may be respectively provided on the PMOSFET region PR and the NMOSFET region NR. The first and second active patterns AP1 and AP2 may extend lengthwise in a second direction D2. The first and second directions D1 and D2 may be parallel to a top surface of the substrate 100 and perpendicular to each another. The first and second active patterns AP1 and AP2 may be vertically protruding portions of the substrate 100. For example, the first and second active patterns AP1 and AP2 may protrude from the substrate 100 in a third direction D3. The third direction D3 may be perpendicular to the top surface of the substrate 100.

The trench TR may be filled with a device isolation layer ST. The device isolation layer ST may include a silicon oxide layer. The device isolation layer ST may not cover any of first and second channel patterns CH1 and CH2 which will be discussed below.

A first channel pattern CH1 may be provided on the first active pattern AP1. A second channel pattern CH2 may be provided on the second active pattern AP2. Each of the first and second channel patterns CH1 and CH2 may include a first semiconductor pattern SP1, a second semiconductor pattern SP2, and a third semiconductor pattern SP3 that are sequentially stacked. The first, second, and third semiconductor patterns SP1, SP2, and SP3 may be spaced apart from each other in a vertical direction or a third direction D3. The third semiconductor pattern SP3 may be an uppermost semiconductor pattern of the first, second, and third semiconductor patterns SP1, SP2, and SP3.

Each of the first, second, and third semiconductor patterns SP1, SP2, and SP3 may include silicon (Si), germanium (Ge), or silicon-germanium (SiGe). For example, each of the first, second, and third semiconductor patterns SP1, SP2, and SP3 may include crystalline silicon.

A plurality of first source/drain patterns SD1 may be provided on the first active pattern AP1. A plurality of first recessions RS1 may be formed on an upper portion of the first active pattern AP1. The first source/drain patterns SD1 may be provided in corresponding first recessions RS1. The first source/drain patterns SD1 may be impurity regions having a first conductivity type (e.g., p-type). The first channel pattern CH1 may be interposed between a pair of first source/drain patterns SD1. For example, the pair of first source/drain patterns SD1 may be connected to each other through the first, second, and third semiconductor patterns SP1, SP2, and SP3 that are stacked. In some embodiments, a top surface of the first source/drain pattern SD1 may be coplanar with a top surface of the third semiconductor pattern SP3.

A plurality of second source/drain patterns SD2 may be provided on the second active pattern AP2. A plurality of second recessions RS2 may be formed on an upper portion of the second active pattern AP2. The second source/drain patterns SD2 may be provided in corresponding second recessions RS2. The second source/drain patterns SD2 may be impurity regions having a second conductivity type (e.g., n-type). The second channel pattern CH2 may be interposed between a pair of second source/drain patterns SD2. For example, the pair of second source/drain patterns SD2 may be connected to each other through the first, second, and third semiconductor patterns SP1, SP2, and SP3 that are stacked. In some embodiments, a top surface of the second source/drain pattern SD2 may be coplanar with a top surface of the third semiconductor pattern SP3. As used herein, terms such as "same," "equal," "planar," or "coplanar" encompass near identicality including variations that may occur, for example, due to manufacturing processes.

The first and second source/drain patterns SD1 and SD2 may be epitaxial patterns formed by a selective epitaxial growth process. For example, each of the first and second source/drain patterns SD1 and SD2 may have a top surface at a vertical level substantially the same as that of a top surface of the third semiconductor pattern SP3. For another example, each of the first and second source/drain patterns SD1 and SD2 may have a top surface at a vertical level higher than that of a top surface of the third semiconductor pattern SP3. As used herein, a vertical level may refer to a level in the third direction D3.

The first source/drain patterns SD1 may include a semiconductor element (e.g., SiGe) of which lattice constant is greater than that of a semiconductor element of the substrate 100. Therefore, a pair of first source/drain patterns SD1 may provide the first channel pattern CH1 with compressive stress. The second source/drain patterns SD2 may include the same semiconductor element (e.g., Si) as that of the substrate 100.

Each of the first source/drain patterns SD1 may include a first semiconductor layer SEL1 and a second semiconductor layer SEL2 on the first semiconductor layer SEL1. With reference back to FIG. 2A, the following will describe a cross-sectional shape in the second direction D2 of the first source/drain pattern SD1.

The first semiconductor layer SEL1 may cover an inner wall of the first recession RS1. The first semiconductor layer SEL1 may have a thickness that decreases as approaching an upper portion thereof from a lower portion thereof. For example, a thickness in the third direction D3 of the first semiconductor layer SEL1 on a floor of the first recession RS1 may be greater than a thickness in the second direction D2 of the first semiconductor layer SEL1 on an upper portion of the first recession RS1. The first semiconductor layer SEL1 may be shaped like U along a profile of the first recession RS1.

The second semiconductor layer SEL2 may fill a remaining portion of the first recession RS1 that is filled with the first semiconductor layer SEL1. The second semiconductor layer SEL2 may have a volume greater than that of the first semiconductor layer SEL1. For example, a ratio of the volume of the second semiconductor layer SEL2 to a total volume of the first source/drain pattern SD1 may be greater than a ratio of the volume of the first semiconductor layer SEL1 to a total volume of the first source/drain pattern SD1.

Each of the first and second semiconductor layers SEL1 and SEL2 may include silicon-germanium (SiGe). For example, the first semiconductor layer SEL1 may contain germanium (Ge) of which concentration is relatively low. In some embodiments of the present inventive concepts, the first semiconductor layer SEL1 may include only silicon (Si) rather than germanium (Ge). The first semiconductor layer SEL1 may have a germanium concentration of about 0 at % to about 10 at %.

The second semiconductor layer SEL2 may contain germanium (Ge) of which concentration is relatively high. For example, the second semiconductor layer SEL2 may have a germanium concentration of about 30 at % to about 75 at %. The germanium concentration of the second semiconductor layer SEL2 may increase in the third direction D3. For example, the second semiconductor layer SEL2 adjacent to the first semiconductor layer SEL1 may have a germanium concentration of about 40 at %, but an upper portion of the second semiconductor layer SEL2 may have a germanium concentration of about 60 at %.

The first and second semiconductor layers SEL1 and SEL2 may include impurities (e.g., boron) that cause the first source/drain pattern SD1 to have a p-type conductivity type. An impurity concentration (e.g., atomic percent) of the second semiconductor layer SEL2 may be greater than that of the first semiconductor layer SEL1.

The first semiconductor layer SEL1 may prevent stacking faults between the substrate 100 and the second semiconductor layer SEL2 and between the second semiconductor layer SEL2 and the first, second, and third semiconductor patterns SP1, SP2, and SP3. The occurrence of stacking faults may increase a channel resistance. The stacking faults may easily occur at bottom of the first recession RS1. Accordingly, to prevent the stacking faults, it may be preferable that the first semiconductor layer SEL1 adjacent to the floor of the first recession RS1 has a relatively large thickness.

The first semiconductor layer SEL1 may protect the second semiconductor layer SEL2 while sacrificial layers SAL are replaced with first, second, and third inner gate electrodes IGE1, IGE2, and IGE3 of a gate electrode GE, which will be discussed below. For example, the first semiconductor layer SEL1 may prevent the second semiconductor layer SEL2 from being etched with an etching material that etches the sacrificial layers SAL.

Gate electrodes GE may be provided to extend lengthwise in the first direction D1, while running across the first and second channel patterns CH1 and CH2. The gate electrodes GE may be arranged at a first pitch P1 in the second direction D2. Each of the gate electrodes GE may vertically overlap the first and second channel patterns CH1 and CH2.

Referring back to FIG. 2D, the gate electrode GE may be provided on top and bottom surfaces and opposite sidewalls of each of the first, second, and third semiconductor patterns SP1, SP2, and SP3. In this sense, a transistor according to the present embodiment may be a three-dimensional field effect transistor (e.g., MBCFET) in which the gate electrode GE three-dimensionally surrounds the first and second channel patterns CH1 and CH2.

Each of the gate electrodes GE may include an inner gate electrode IGEa (or IGEb) and an outer gate electrode OGE. The inner gate electrode IGEa on the PMOSFET region PR may vertically overlap the first channel pattern CH1. The inner gate electrode IGEa may include a first inner gate electrode IGE1 between the first active pattern AP1 and the first semiconductor pattern SP1, a second inner gate electrode IGE2 between the first semiconductor pattern SP1 and the second semiconductor pattern SP2, and a third inner gate electrode IGE3 between the second semiconductor pattern SP2 and the third semiconductor pattern SP3. The third inner gate electrode IGE3 may be an uppermost inner gate electrode of the first, second, and third inner gate electrodes IGE1, IGE2, and IGE3.

Referring back to FIG. 2A, on the PMOSFET region PR, the first, second, and third inner gate electrodes IGE1, IGE2, and IGE3 may have different widths from each other. For example, the third inner gate electrode IGE3 may have a maximum width in the second direction D2 greater than a maximum width in the second direction D2 of the second inner gate electrode IGE2. The first inner gate electrode IGE1 may have a maximum width in the second direction D2 greater than the maximum width in the second direction D2 of the third inner gate electrode IGE3.

Referring back to FIG. 2D, on the PMOSFET region PR, a first fin structure FST1 may be constituted by the first, second, and third inner gate electrodes IGE1, IGE2, and IGE3 and the first, second, and third semiconductor patterns SP1, SP2, and SP3. For example, the first fin structure FST1 may include the first, second, and third inner gate electrodes IGE1, IGE2, and IGE3 and the first, second, and third semiconductor patterns SP1, SP2, and SP3 that are alternately stacked. The first fin structure FST1 may have a fin shape that protrudes in a vertical direction (or, the third direction D3) from the first active pattern AP1. The first fin structure FST1 may upwardly protrude beyond a top surface of the device isolation layer ST.

Figure 2A:
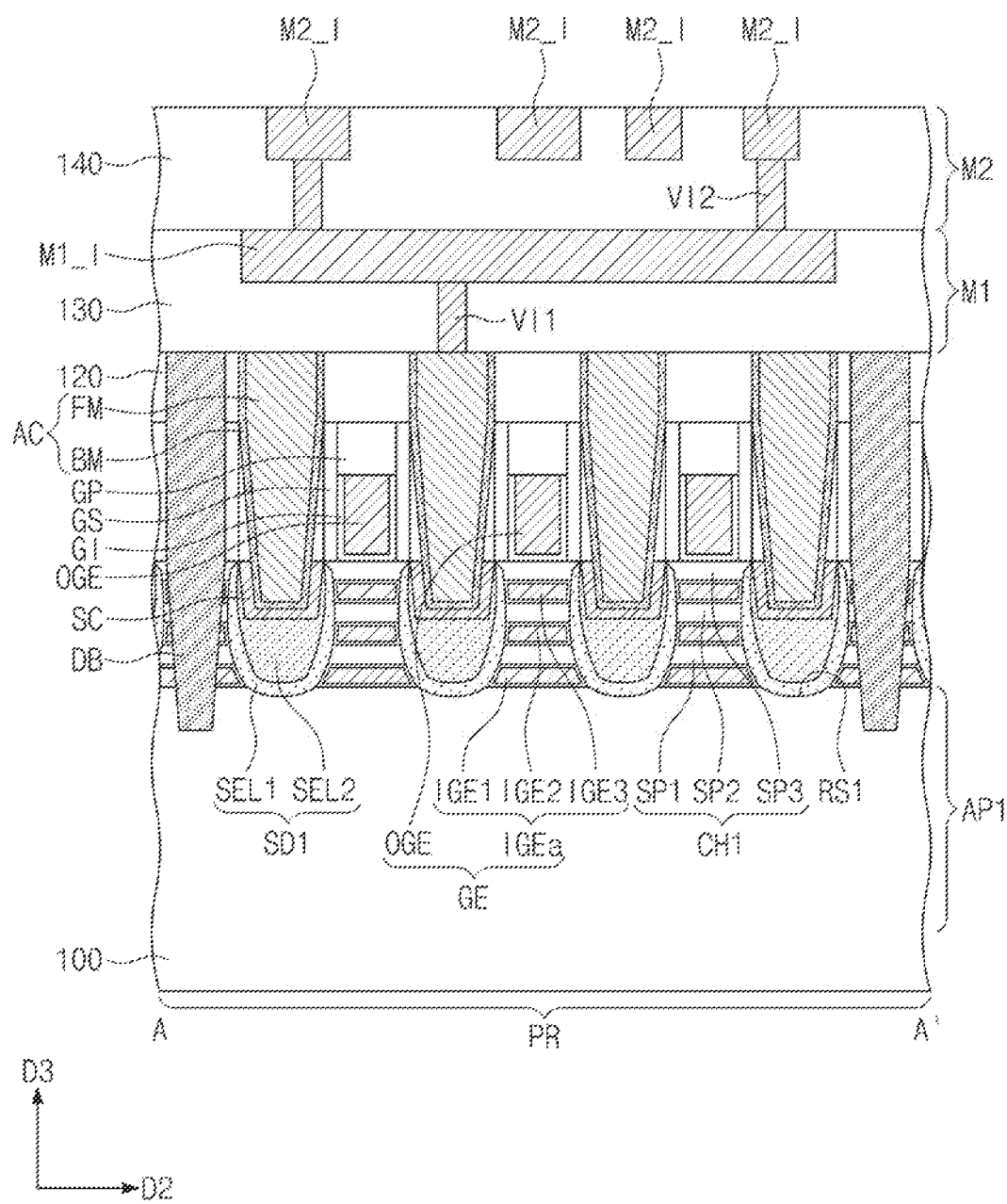
FIGS. 2A, 2B, 2C, and 2D illustrate cross-sectional views respectively taken along lines A-A', B-B', C-C', and D-D' of FIG. 1.
Figure 2B:
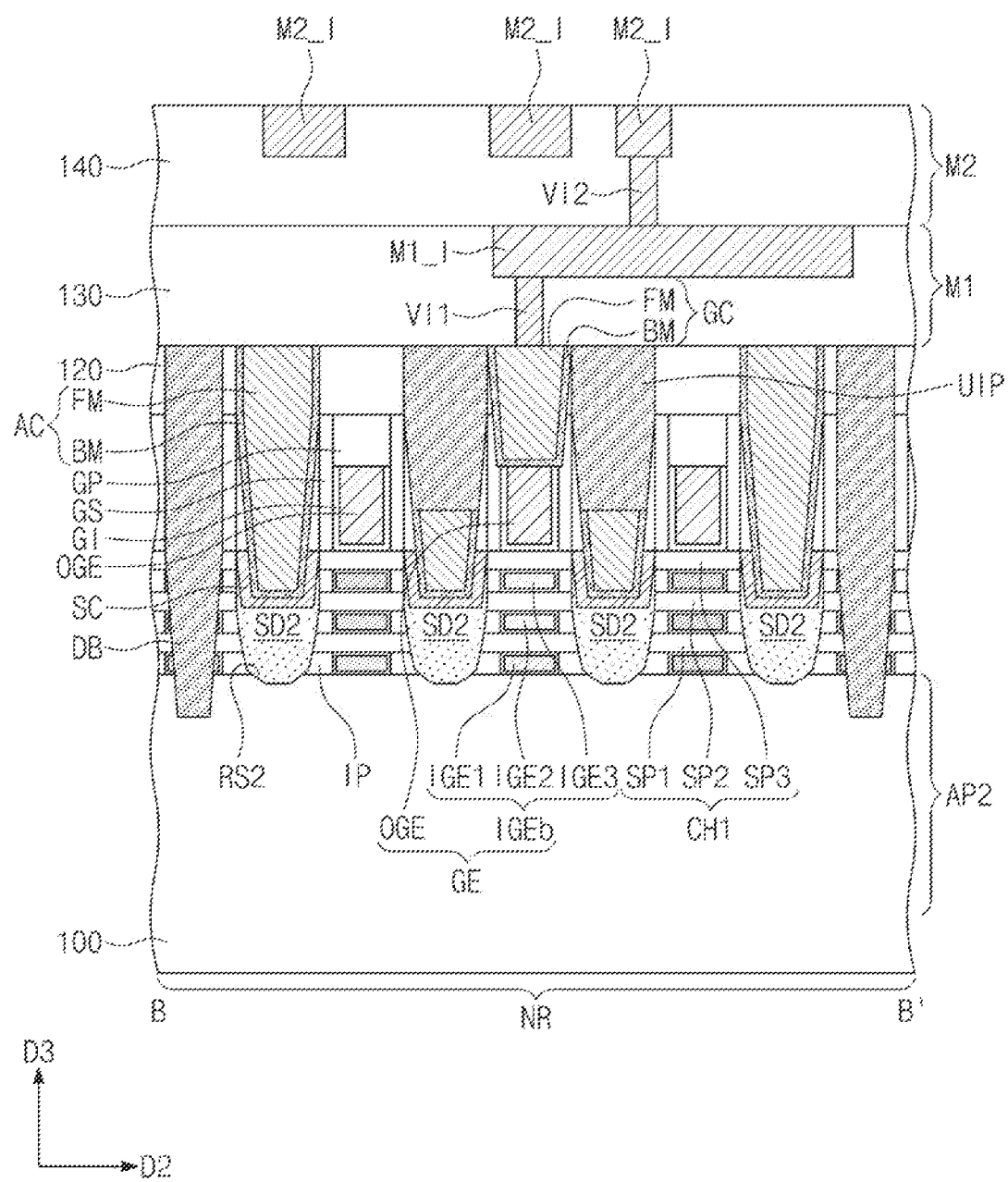
Figure 2C:
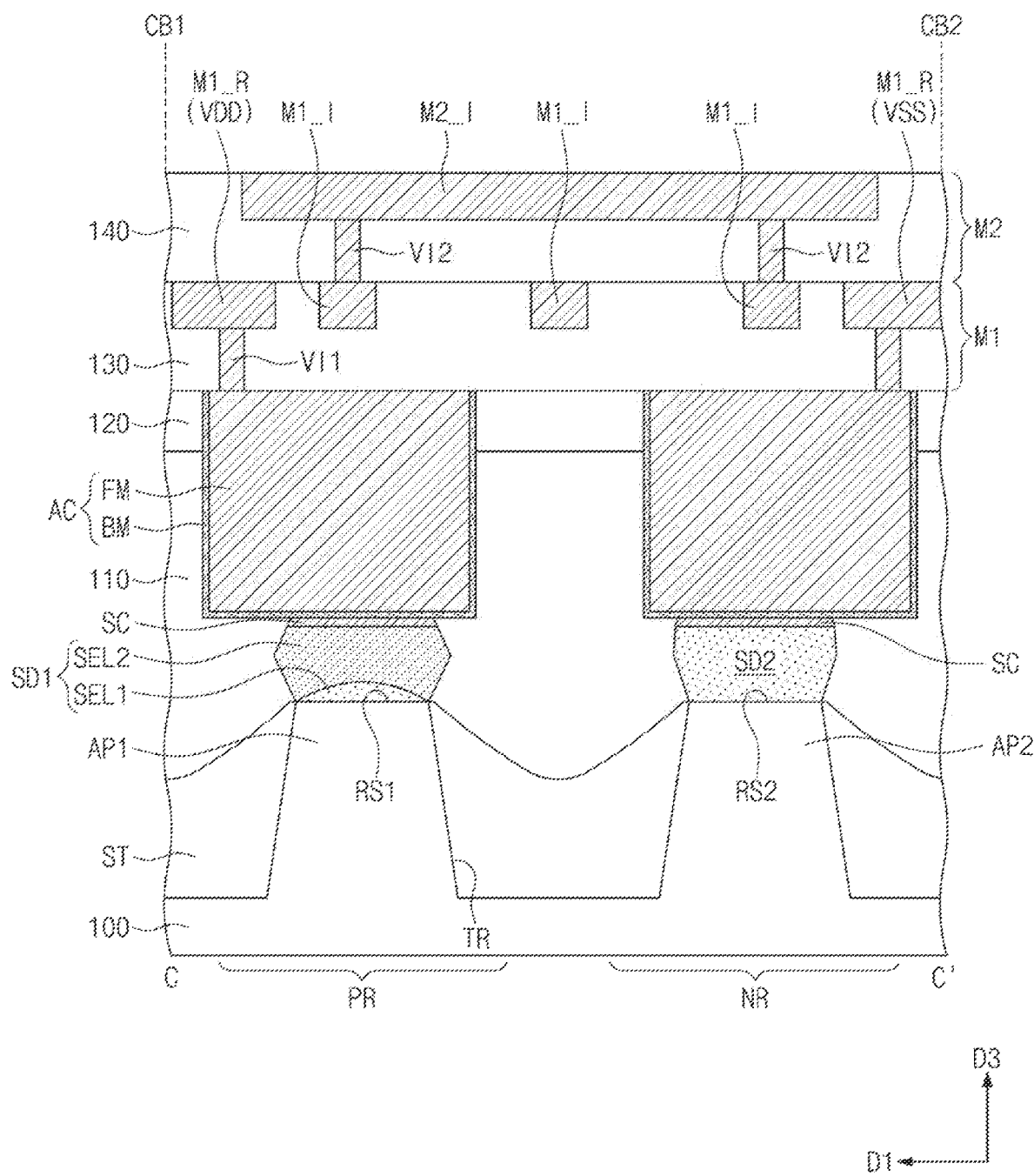
Figure 2D:
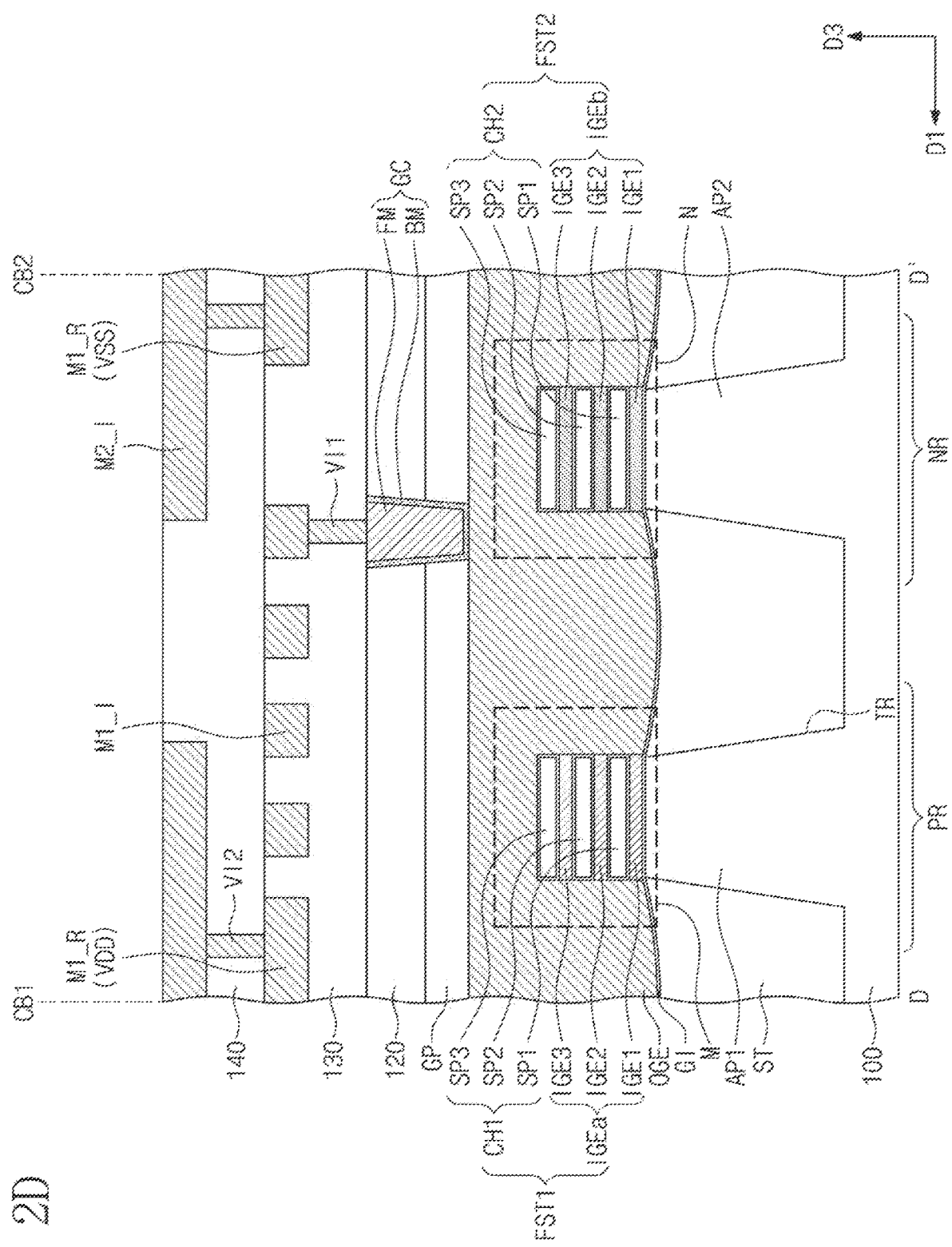
Figure 3A:
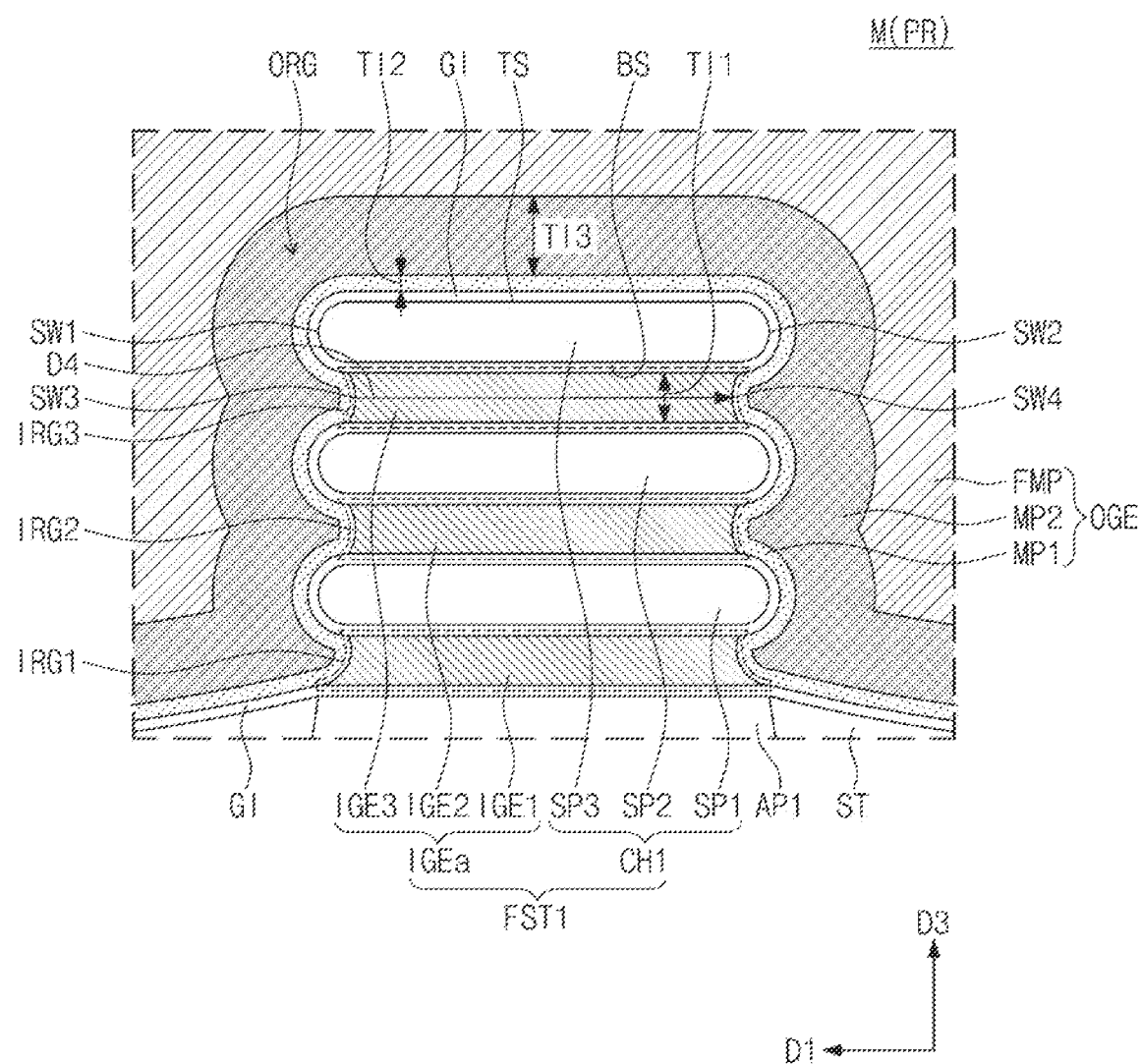
FIG. 3A illustrates an enlarged cross-sectional view showing section M of FIG. 2D.
Figure 3B:
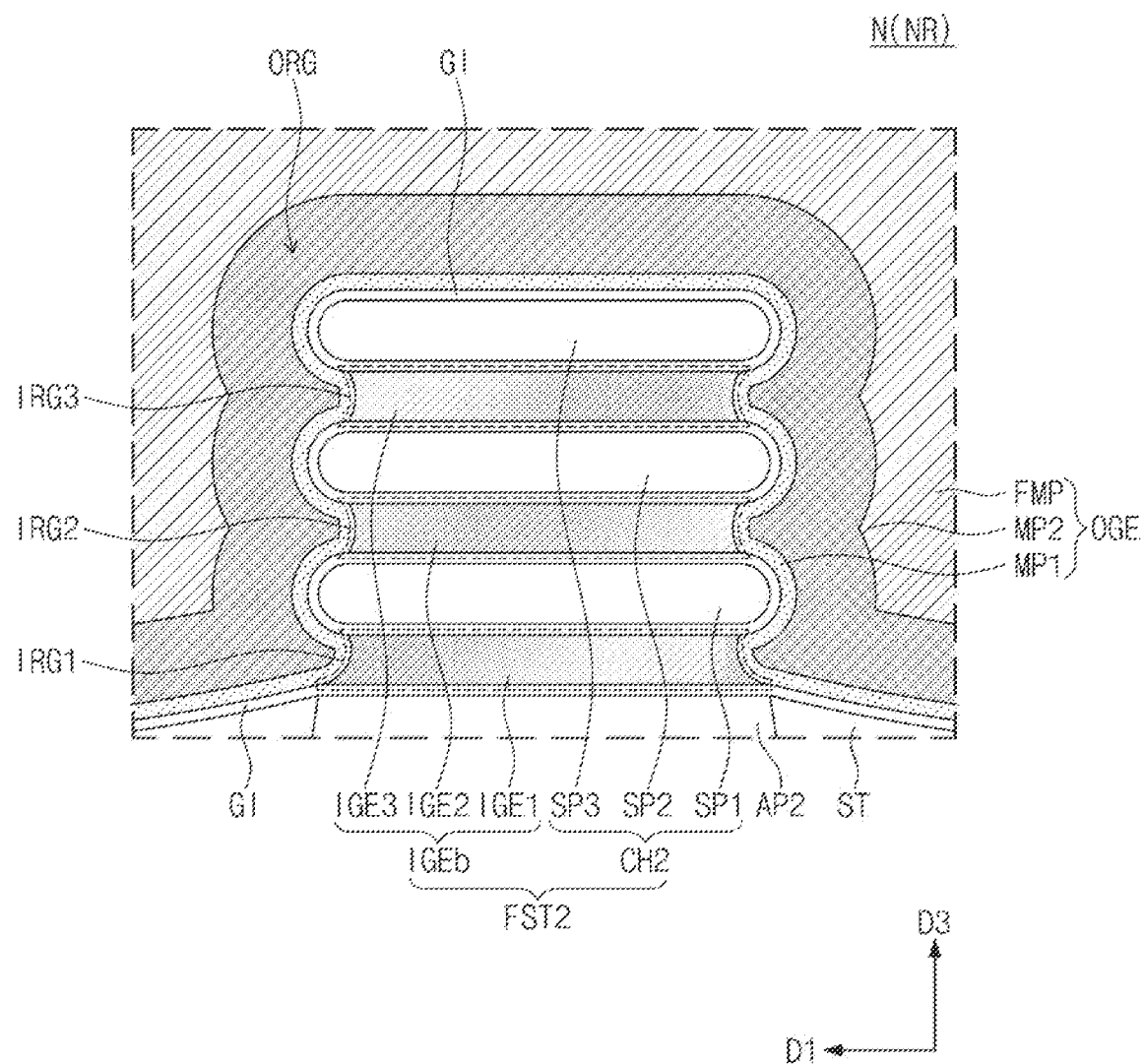
FIG. 3B illustrates an enlarged cross-sectional view showing section N of FIG. 2D.

On the PMOSFET region PR, the outer gate electrode OGE may surround the first fin structure FST1 (see FIG. 2D). For example, the outer gate electrode OGE may be provided on a top surface and opposite sidewalls of the first fin structure FST1. In this sense, the outer gate electrode OGE may not be provided in a space between the first, second, and third semiconductor patterns SP1, SP2, and SP3 that are adjacent to each other.

On the NMOSFET region NR, the inner gate electrode IGEb may vertically overlap the second channel pattern CH2. The inner gate electrode IGEb may include a first inner gate electrode IGE1 between the second active pattern AP2 and the first semiconductor pattern SP1, a second inner gate electrode IGE2 between the first semiconductor pattern SP1 and the second semiconductor pattern SP2, and a third inner gate electrode IGE3 between the second semiconductor pattern SP2 and the third semiconductor pattern SP3.

Referring back to FIG. 2D, on the NMOSFET region NR, a second fin structure FST2 may be constituted by the first, second, and third inner gate electrodes IGE1, IGE2, and IGE3 and the first, second, and third semiconductor patterns SP1, SP2, and SP3. For example, the second fin structure FST2 may include the first, second, and third inner gate electrodes IGE1, IGE2, and IGE3 and the first, second, and third semiconductor patterns SP1, SP2, and SP3 that are alternately stacked. The second fin structure FST2 may have a fin shape that protrudes in the third direction D3 from the second active pattern AP2. On the NMOSFET region NR, the outer gate electrode OGE may surround the second fin structure FST2.

Referring back to FIGS. 1 and 2A to 2D, a pair of gate spacers GS may be disposed on opposite sidewalls of the outer gate electrode OGE. The gate spacers GS may extend lengthwise in the first direction D1 along the gate electrode GE. The gate spacers GS may have top surfaces higher than that of the outer gate electrode OGE. The top surfaces of the gate spacers GS may be coplanar with the top surface of a first interlayer dielectric layer 110 which will be discussed below. The gate spacers GS may include at least one selected from SiCN, SiCON, and SiN. Alternatively, the gate spacers GS may each include a multi-layer formed of at least two selected from SiCN, SiCON, and SiN.

A gate capping pattern GP may be provided on the gate electrode GE. The gate capping pattern GP may extend lengthwise in the first direction D1 along the gate electrode GE. The gate capping pattern GP may include a material having an etch selectivity with respect to first and second interlayer dielectric layers 110 and 120 which will be discussed below. For example, the gate capping pattern GP may include at least one selected from SiON, SiCN, SiCON, and SiN. The top surfaces of the gate spacers GS may be coplanar with a top surface of the gate capping pattern GP.

A gate dielectric layer GI may be interposed between the gate electrode GE and the first channel pattern CH1 and between the gate electrode GE and the second channel pattern CH2. The gate dielectric layer GI may cover the top and bottom surfaces and the opposite sidewalls of each of the first, second, and third semiconductor patterns SP1, SP2, and SP3. The gate dielectric layer GI may cover the top surface of the device isolation layer ST that underlies the gate electrode GE (see FIG. 2D).

In an embodiment of the present inventive concepts, the gate dielectric layer GI may include one or more of a silicon oxide layer, a silicon oxynitride layer, and a high-k dielectric layer. For example, the gate dielectric layer GI may have a structure in which a silicon oxide layer and a high-k dielectric layer are stacked. The high-k dielectric layer may include a material of which dielectric constant is greater than that of a silicon oxide layer. For example, the high-k dielectric material may include at least one selected from hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

In another embodiment, a semiconductor device according to the present inventive concepts may include a negative capacitance field effect transistor that uses a negative capacitor. For example, the gate dielectric layer GI may include a ferroelectric material layer having ferroelectric properties and a paraelectric material layer having paraelectric properties.

The ferroelectric material layer may have a negative capacitance, and the paraelectric material layer may have a positive capacitance. For example, when two or more capacitors are connected in series, and when each capacitor has a positive capacitance, an overall capacitance may be reduced to be less than the capacitance of each capacitor. In contrast, when at least one of two or more capacitors connected in series has a negative capacitance, an overall capacitance may have a positive value that is increased to be greater than an absolute value of the capacitance of each capacitor.

When the ferroelectric material layer having a negative capacitance is connected in series to the paraelectric material layer having a positive capacitance, there may be an increase in overall capacitance of the ferroelectric and paraelectric material layers that are connected in series. The increase in overall capacitance may be used to allow a transistor including the ferroelectric material layer to have a sub-threshold swing of less than about 60 mV/decade at room temperature.

The ferroelectric material layer may have ferroelectric properties. The ferroelectric material layer may include, for example, at least one selected from hafnium oxide, hafnium zirconium oxide, barium strontium titanium oxide, and lead zirconium titanium oxide. For example, the hafnium zirconium oxide may be a material in which hafnium oxide is doped with zirconium (Zr). For another example, the hafnium zirconium oxide may be a compound of hafnium (Hf), zirconium (Zr), and oxygen (O).

The ferroelectric material layer may further include impurities doped thereinto. For example, the impurities may include at least one selected from aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and tin (Sn). A kind of impurities included in the ferroelectric material layer may be changed depending on what ferroelectric material is included in the ferroelectric material layer.

When the ferroelectric material layer includes hafnium oxide, the ferroelectric material layer may include at least one of impurities such as gadolinium (Gd), silicon (Si), zirconium (Zr), aluminum (Al), and yttrium (Y).

When the impurities are aluminum (Al), the ferroelectric material layer may include about 3 to 8 atomic percent aluminum. In this description, the ratio of impurities may be a ratio of aluminum to the sum of hafnium and aluminum.

When the impurities are silicon (Si), the ferroelectric material layer may include about 2 to 10 atomic percent silicon. When the impurities are yttrium (Y), the ferroelectric material layer may include about 2 to 10 atomic percent yttrium. When the impurities are gadolinium (Gd), the ferroelectric material layer may include about 1 to 7 atomic percent gadolinium. When the impurities are zirconium (Zr), the ferroelectric material layer may include about 50 to 80 atomic percent zirconium.

The paraelectric material layer may have paraelectric properties. The paraelectric material layer may include, for example, at least one selected from silicon oxide and high-k metal oxide. The metal oxide included in the paraelectric material layer may include, for example, at least one selected from hafnium oxide, zirconium oxide, and aluminum oxide, but the present inventive concepts are not limited thereto.

The ferroelectric and paraelectric material layers may include the same material. The ferroelectric material layer may have ferroelectric properties, but the paraelectric material layer may not have ferroelectric properties. For example, when the ferroelectric material layer and the paraelectric material layer include hafnium oxide, the hafnium oxide included in the ferroelectric material layer may have a different crystal structure from that of the hafnium oxide included in the paraelectric material layer.

The ferroelectric material layer may have a thickness having ferroelectric properties. The thickness of the ferroelectric material layer may range, for example, from about 0.5 nm to about 10 nm, but the present inventive concepts are not limited thereto. Because ferroelectric materials have their own critical thickness that exhibits ferroelectric properties, the thickness of the ferroelectric material layer may depend on ferroelectric material.

For example, the gate dielectric layer GI may include a single ferroelectric material layer. For another example, the gate dielectric layer GI may include a plurality of ferroelectric layers that are spaced apart from each other. The gate dielectric layer GI may have a stack structure in which a plurality of ferroelectric material layers are alternately stacked with a plurality of paraelectric material layers.

Referring back to FIG. 2B, inner spacers IP may be provided on the NMOSFET region NR. The inner spacers IP may be correspondingly interposed between the second source/drain pattern SD2 and the first, second, and third inner gate electrodes IGE1, IGE2, and IGE3 of the inner gate electrode IGEb. The inner spacers IP may be in direct contact with the second source/drain pattern SD2. The inner spacer IP may cause each of the first, second, and third inner gate electrodes IGE1, IGE2, and IGE3 of the inner gate electrode IGEb to be separated, or spaced apart, from the second source/drain pattern SD2.

A first interlayer dielectric layer 110 may be provided on the substrate 100. The first interlayer dielectric layer 110 may cover the gate spacers GS and the first and second source/drain patterns SD1 and SD2. The first interlayer dielectric layer 110 may have a top surface substantially coplanar with that of the gate capping pattern GP and that of the gate spacer GS. The first interlayer dielectric layer 110 may be provided thereon with a second interlayer dielectric layer 120 that covers the gate capping pattern GP. A bottom surface of the second interlayer dielectric layer 120 may contact the top surfaces of the first interlayer dielectric layer 110, the gate spacers GS, and the gate capping pattern GP. For example, the first and second interlayer dielectric layers 110 and 120 may include a silicon oxide layer.

The logic cell LC may have, on opposite sides thereof, a pair of separation structures DB that face each other in the second direction D2. The separation structure DB may extend lengthwise in the first direction D1 parallel to the gate electrodes GE. The separation structure DB and its adjacent gate electrode GE may be arranged at the same pitch as the first pitch P1.

The separation structure DB may penetrate the first and second interlayer dielectric layers 110 and 120, and may extend into the first and second active patterns AP1 and AP2. For example, a bottom surface of the separation structure DB may be at a lower vertical level than top surfaces of the first and second active patterns AP1 and AP2. The separation structure DB may penetrate the first and second channel patterns CH1 and CH2. The separation structure DB may separate the PMOSFET and NMOSFET regions PR and NR of the logic cell LC from a PMOSFET or NMOSFET region of an adjacent logic cell.

Active contacts AC may be provided to penetrate the first and second interlayer dielectric layers 110 and 120 and to correspondingly have electrical connection with the first and second source/drain patterns SD1 and SD2. A pair of active contacts AC may be provided on opposite sides of the gate electrode GE. When viewed in plan, the active contact AC may have a bar shape that extends lengthwise in the first direction D1.

The active contact AC may be a self-aligned contact. For example, the gate capping pattern GP and the gate spacer GS may be used to form the active contact AC in a self-alignment manner. For example, the active contact AC may cover at least a portion of a sidewall of the gate spacer GS. Although not shown, the active contact AC may cover a portion of the top surface of the gate capping pattern GP.

Silicide patterns SC may be correspondingly interposed between the active contact AC and the first source/drain pattern SD1 and between the active contact AC and the second source/drain pattern SD2. For example, the silicide patterns SC may cover bottom and side surfaces of the active contacts AC. Each of the active contacts AC may be electrically connected through the silicide pattern SC to one of the first and second source/drain patterns SD1 and SD2. The silicide pattern SC may include metal silicide, for example, at least one selected from titanium silicide, tantalum silicide, tungsten silicide, nickel silicide, and cobalt silicide.

A gate contact GC may be provided to penetrate the second interlayer dielectric layer 120 and the gate capping pattern GP and to have electrical connection with the gate electrode GE. For example, referring to FIG. 2B, an upper dielectric pattern UIP may fill an upper portion of each of the active contacts AC, which have an upper portion adjacent to the gate contact GC. Therefore, it may be possible to prevent process failure such as an electrical short caused by contact between the gate contact GC and its adjacent active contact AC.

Each of the active contact AC and the gate contact GC may include a conductive pattern FM and a barrier pattern BM that surrounds the conductive pattern FM. For example, the conductive pattern FM may include at least one metal selected from aluminum, copper, tungsten, molybdenum, and cobalt. The barrier pattern BM may cover sidewalls and a bottom surface of the conductive pattern FM. The barrier pattern BM may include a metal layer and a metal nitride layer. The metal layer may include at least one selected from titanium, tantalum, tungsten, nickel, cobalt, and platinum. The metal nitride layer may include at least one selected from a titanium nitride (TiN) layer, a tantalum nitride (TaN) layer, a tungsten nitride (WN) layer, a nickel nitride (NiN) layer, a cobalt nitride (CoN) layer, and a platinum nitride (PtN) layer.

A first metal layer M1 may be provided in a third interlayer dielectric layer 130. The first metal layer M1 may include first lower lines M1_R, second lower lines M1_I, and lower vias VI1. The lower vias VI1 may be provided below the first and second lower lines M1_R and M1_I. The lower vias VI1 may contact lower surfaces of the first and second lower lines M1_R and M1_I.

Each of the first lower lines M1_R may extend lengthwise in the second direction D2, while running across the logic cell LC. Each of the first lower lines M1_R may be a power line. For example, the first lower line M1_R may be supplied with a drain voltage VDD or a source voltage VSS.

Referring to FIG. 1, the logic cell LC may include a first cell boundary CB1 that extends lengthwise in the second direction D2. On the logic cell LC, a second cell boundary CB2 may be defined on a location opposite to that on which the first cell boundary CB1 is defined. The second cell boundary CB2 may extend lengthwise in the second direction D2 in parallel to the first cell boundary CB1. The first cell boundary CB1 may be provided thereon with the first lower line M1_R to which is applied the drain voltage VDD or power voltage. The first lower line M1_R to which the drain voltage VDD is applied may extend lengthwise in the second direction D2 along the first cell boundary CB1. The second cell boundary CB2 may be provided thereon with the first lower line M1_R to which is applied the source voltage VSS or ground voltage. The first lower line M1_R to which the source voltage VSS is applied may extend lengthwise in the second direction D2 along the second cell boundary CB2.

The second lower lines M1_I may be disposed along the first direction D1 between the first lower line M1_R to which the drain voltage VDD is applied and the first lower line M1_R to which the source voltage VSS is applied. Each of the second lower lines M1_I may have a linear or bar shape that extends lengthwise in the second direction D2. The second lower lines M1_I may be arranged at a second pitch P2 in the first direction D1. The second pitch P2 may be less than the first pitch P1.

The lower vias VI1 may be provided below the first and second lower lines M1_R and M1_I of the first metal layer M1. The lower vias VI1 may be correspondingly interposed between the active contacts AC and the first and second lower lines M1_R and M1_I. The lower vias VI1 may be correspondingly interposed between the gate contacts GC and the second lower lines M1_I.

The lower line M1_R or M1_I and its underling lower via VI1 of the first metal layer M1 may be formed by processes performed separately from each other. For example, the lower line M1_R or M1_I and the lower via VI1 may each be formed by a single damascene process. For example, a sub-20 nm process may be employed to fabricate a semiconductor device according to the present embodiment.

A second metal layer M2 may be provided in a fourth interlayer dielectric layer 140. The second metal layer M2 may include upper lines M2_I. Each of the upper lines M2_I may have a linear or bar shape that extends lengthwise in the second direction D2. For example, the upper lines M2_I may extend parallel to each other in the first direction D1. When viewed in plan, the upper lines M2_I may be parallel to the gate electrodes GE. The upper lines M2_I may be arranged at a third pitch P3 along the second direction D2. The third pitch P3 may be less than the first pitch P1. The third pitch P3 may be greater than the second pitch P2.

The second metal layer M2 may further include upper vias VI2. The upper vias VI2 may be provided below the upper lines M2_I. The upper vias VI2 may be correspondingly interposed between the upper lines M2_I and the lower lines M1_R and M1_I. The upper vias VI2 may contact lower surfaces of the upper lines M2_I and upper surfaces of the lower lines M1_R and M1_I.

The upper line M2_I of the second metal layer M2 and its underlying upper via VI2 may be formed into a single piece in the same process. For example, a dual damascene process may be employed to simultaneously form the upper via VI2 and the upper line M2_I of the second metal layer M2.

The lower lines M1_R and M1_I of the first metal layer M1 may include a conductive material the same as or different from that of the upper lines M2_I of the second metal layer M2. For example, the lower lines M1_R and M1_I and the upper lines M2_I may include at least one metallic material selected from aluminum, copper, tungsten, molybdenum, and cobalt.

In an embodiment of the present inventive concepts, although not shown, metal layers (e.g., M3, M4, M5, etc.) may be additionally stacked on the fourth interlayer dielectric layer 140. Each of the stacked metal layers may include routing lines.

With reference to FIG. 3A, the following description will focus on the gate electrode GE on the PMOSFET region PR, or on the inner gate electrode IGEa and the outer gate electrode OGE.

A first inner area IRG1 may be defined between the first active pattern AP1 and the first semiconductor pattern SP1, a second inner area IRG2 may be defined between the first semiconductor pattern SP1 and the second semiconductor pattern SP2, and a third inner area IRG3 may be defined between the second semiconductor pattern SP2 and the third semiconductor pattern SP3. For example, the first fin structure FST1 may be configured such that the first, second, and third inner areas IRG1, IRG2, and IRG3 may be regions other than the first channel pattern CH1. An outer area ORG may be defined to refer to a remaining region that surrounds the first fin structure FST1.

The first, second, and third inner gate electrodes IGE1, IGE2, and IGE3 may be respectively provided in the first, second, and third inner areas IRG1, IRG2, and IRG3. The outer gate electrode OGE may be provided in the outer area ORG.

The first, second, and third inner gate electrodes IGE1, IGE2, and IGE3 may include the same material. The first, second, and third inner gate electrodes IGE1, IGE2, and IGE3 may include a first work-function metal that adjusts a threshold voltage of a transistor. A composition of the first work-function metal may be adjusted to achieve a desired threshold voltage of a transistor. For example, the first work-function metal may be a p-type work-function metal of which a work function is relatively high.

The inner gate electrode IGEa, or the first, second, and third inner gate electrodes IGE1, IGE2, and IGE3, may include a metal nitride layer. The inner gate electrode IGEa may include nitrogen (N) and at least one metal selected from titanium (Ti), tantalum (Ta), aluminum (Al), tungsten (W), and molybdenum (Mo). For example, the inner gate electrode IGEa may include titanium nitride (TiN), tantalum nitride (TaN), titanium oxynitride (TiON), titanium silicon nitride (TiSiN), titanium aluminum nitride (TiAlN), tungsten carbon nitride (WCN), or molybdenum nitride (MoN).

In some embodiments, the third inner gate electrode IGE3 may be adjacent to a bottom surface BS of the third semiconductor pattern SP3. A first sidewall SW1 of the third semiconductor pattern SP3 may horizontally protrude more than a third sidewall SW3 of the third inner gate electrode IGE3. A second sidewall SW2 of the third semiconductor pattern SP3 may horizontally protrude more than a fourth sidewall SW4 of the third inner gate electrode IGE3. As a result, a width in the first direction D1 of the third inner gate electrode IGE3 may be less than a width in the first direction D1 of the third semiconductor pattern SP3.

The third inner gate electrode IGE3 may be curved on each of the third and fourth sidewalls SW3 and SW4 thereof. For example, each of the third and fourth sidewalls SW3 and SW4 of the third inner gate electrode IGE3 may be recessed toward a center of the third inner gate electrode IGE3.

The outer gate electrode OGE may include a first metal patterns MP1, a second metal pattern MP2, and a fill metal pattern FMP that are sequentially stacked. The first metal pattern MP1 may conformally cover a surface of the first fin structure FST1. With regard to the first fin structure FST1, the first metal pattern MP1 may directly cover an exposed gate dielectric layer GI and an exposed inner gate electrode IGEa. For example, the first metal pattern MP1 may contact exposed surfaces of the gate dielectric layer GI and the inner gate electrode IGEa. The second metal pattern MP2 may cover the first metal pattern MP1. For example, the second metal pattern MP2 may contact surfaces of the first metal pattern MP1. The second metal pattern MP2 may be interposed between the first metal pattern MP1 and the fill metal pattern FMP.

The first metal pattern MP1 may be a capping layer that is interposed between the second metal pattern MP2 and the inner gate electrode IGEa. The first metal pattern MP1 may include a metal nitride layer. The first metal pattern MP1 may include nitrogen (N) and at least one metal selected from titanium (Ti), tantalum (Ta), aluminum (Al), tungsten (W), and molybdenum (Mo). The first metal pattern MP1 may include a metal nitride layer the same as or different from that of the inner gate electrode IGEa. For example, the first metal pattern MP1 may include TiN.

In some embodiments, the first metal pattern MP1 may be provided on a top surface TS and opposite sidewalls SW1 and SW2 of the third semiconductor pattern SP3. The first metal pattern MP1 may contact the top surface TS and opposite sidewalls SW1 and SW2 of the third semiconductor pattern SP3. As discussed above, the third inner gate electrode IGE3 may be provided on the bottom surface BS of the third semiconductor pattern SP3. The first metal pattern MP1 may be provided on opposite sidewalls SW3 and SW4 of the third inner gate electrode IGE3. The first metal pattern MP1 may be in direct contact with the opposite sidewalls SW3 and SW4 of the third inner gate electrode IGE3.

The third inner gate electrode IGE3 may have a first thickness TI1 in the third direction D3. The first metal pattern MP1 on the top surface TS of the third semiconductor pattern SP3 may have a second thickness TI2 in the third direction D3. The first thickness TI1 may be greater than the second thickness TI2. For example, the first thickness TI1 may be about 2.5 times to about 10 times the second thickness TI2.

The second metal pattern MP2 may be provided on the first metal pattern MP1. The second metal pattern MP2 may include a second work-function metal that adjusts a threshold voltage of a transistor. A composition of the second work-function metal may be adjusted to achieve a desired threshold voltage of a transistor. For example, the second work-function metal may be an n-type work-function metal of which a work function is relatively low.

The second metal pattern MP2 may include metal carbide. The second metal pattern MP2 may include metal carbide doped with (or containing) silicon or aluminum. For example, the second metal pattern MP2 may include aluminum-doped titanium carbide (TiAlC), aluminum-doped tantalum carbide (TaAlC), aluminum-doped vanadium carbide (VAlC), silicon-doped titanium carbide (TiSiC), or silicon-doped tantalum carbide (TaSiC). For another example, the second metal pattern MP2 may include aluminum-silicon-doped titanium carbide (TiAlSiC) or aluminum-silicon-doped tantalum carbide (TaAlSiC). For another example, the second metal pattern MP2 may include aluminum-doped titanium (TiAl). For another example, the second metal pattern MP2 may include metal nitride doped with one or both of silicon and aluminum, such as aluminum-doped titanium nitride (TiAlN).

The work function of the second metal pattern MP2 may be altered by controlling a concentration of dopants (or impurities) such as silicon or aluminum. For example, impurities (e.g., silicon or aluminum) in the second metal pattern MP2 may have a concentration ranging from about 0.1 at % to about 25 at %.

The second metal pattern MP2 together with the first metal pattern MP1 may be provided on the top surface and the opposite sidewalls of the first fin structure FST1. The second metal pattern MP2 on the top surface of the first fin structure FST1 may have a third thickness TI3 in the third direction D3. For example, the third thickness TI3 may be greater than the first thickness TI1.

The fill metal pattern FMP may be provided on the second metal pattern MP2. The fill metal pattern FMP may have resistance less than that of the inner gate electrode IGEa and that of the second metal pattern MP2. For example, the fill metal pattern FMP may include at least one low resistance metal such as aluminum (Al), tungsten (W), titanium (Ti), and tantalum (Ta).

In an embodiment of the present inventive concepts, the inner gate electrode IGEa may further include impurities that are diffused from the outer gate electrode OGE. For example, the third inner gate electrode IGE3 may further include impurities that are diffused (or that are derived) from the second metal pattern MP2. The impurities may be one of constituents of the second metal pattern MP2, for example, at least one selected from silicon (Si), aluminum (Al), carbon (C), and nitrogen (N).

Figure 4:
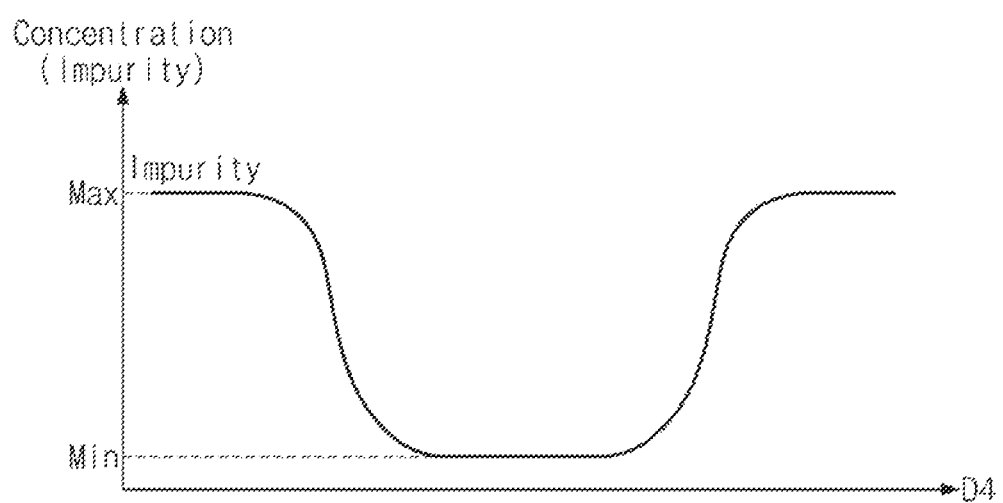
FIG. 4 illustrates a graph showing an impurity concentration profile in a horizontal direction in an inner gate electrode.

FIG. 4 illustrates a graph showing an impurity concentration profile in a horizontal direction in an inner gate electrode. Referring to FIGS. 3A and 4, the third inner gate electrode IGE3 may have therein a variation in impurity concentration in a horizontal direction or a fourth direction D4. The fourth direction D4 may be a horizontal direction that extends toward the fourth sidewall SW4 from the third sidewall SW3 of the third inner gate electrode IGE3. The fourth direction D4 may be parallel to the top surface of the substrate 100.

Along the fourth direction D4, the impurity concentration in the third inner gate electrode IGE3 may gradually decrease from a maximum value Max to reach a minimum value Min, and then may increase to reach the maximum value Max. In this sense, the impurities in the third inner gate electrode IGE3 may have the greatest concentration in the vicinity of the third sidewall SW3 and the fourth sidewall SW4. The impurities in the third inner gate electrode IGE3 may have the lowest concentration at a central portion of the third inner gate electrode IGE3.

Because the third and fourth sidewalls SW3 and SW4 of the third inner gate electrode IGE3 are in contact with the outer gate electrode OGE, the impurities may diffuse into the third inner gate electrode IGE3 through the third sidewall SW3 and the fourth sidewall SW4. Accordingly, it may be possible to obtain the impurity concentration profile as shown in FIG. 4.

With reference to FIG. 3B, the following description will focus on the gate electrode GE on the NMOSFET region NR, or on the inner gate electrode IGEb and the outer gate electrode OGE.

A first inner area IRG1 may be defined between the second active pattern AP2 and the first semiconductor pattern SP1, a second inner area IRG2 may be defined between the first semiconductor pattern SP1 and the second semiconductor pattern SP2, and a third inner area IRG3 may be defined between the second semiconductor pattern SP2 and the third semiconductor pattern SP3. For example, the second fin structure FST2 may be configured such that the first, second, and third inner areas IRG1, IRG2, and IRG3 may be regions other than second channel pattern CH2. An outer area ORG may be defined to refer to a remaining region that surrounds the second fin structure FST2. The first, second, and third inner gate electrodes IGE1, IGE2, and IGE3 may be respectively provided in the first, second, and third inner areas IRG1, IRG2, and IRG3. The outer gate electrode OGE may be provided in the outer area ORG.

The first, second, and third inner gate electrodes IGE1, IGE2, and IGE3 of the inner gate electrode IGEb may include the same material. The first, second, and third inner gate electrodes IGE1, IGE2, and IGE3 may include a third work-function metal that adjusts a threshold voltage of a transistor. A composition of the third work-function metal may be adjusted to achieve a desired threshold voltage of a transistor. The first, second, and third inner gate electrodes IGE1, IGE2, and IGE3 may include nitrogen (N) and at least one metal selected from titanium (Ti), tantalum (Ta), aluminum (Al), tungsten (W), and molybdenum (Mo).

According to an embodiment, the inner gate electrode IGEb on the NMOSFET region NR may include a different material from that of the inner gate electrode IGEa on the PMOSFET region PR. In this sense, the inner gate electrode IGEb on the NMOSFET region NR may have a work function different from that of the inner gate electrode IGEa on the PMOSFET region PR. For example, the work function of the inner gate electrode IGEb on the NMOSFET region NR may be less than the work function of the inner gate electrode IGEa on the PMOSFET region PR.

The inner gate electrode IGEb on the NMOSFET region NR may contain metal or impurities different from those of the inner gate electrode IGEa on the PMOSFET region PR, with the result that a work function may be adjusted differently. For example, when the inner gate electrode IGEa on the PMOSFET region PR includes TiN, the inner gate electrode IGEb on the NMOSFET region NR may include TiAlN.

In an embodiment of the present inventive concepts, the inner gate electrode IGEa on the PMOSFET region PR and the inner gate electrode IGEb on the NMOSFET region NR may all include aluminum-doped titanium nitride (TiAlN) as impurities. However, to allow the inner gate electrodes IGEa and IGEb to have different work functions from each other, the inner gate electrodes IGEa and IGEb may have different aluminum concentrations from each other. For example, the inner gate electrode IGEa on the PMOSFET region PR may have an aluminum concentration different from that of the inner gate electrode IGEb on the NMOSFET region NR.

Other descriptions of the inner gate electrode IGEb on the NMOSFET region NR may be substantially the same as the aforementioned descriptions of the inner gate electrode IGEa on the PMOSFET region PR.

The outer gate electrode OGE on the NMOSFET region NR may include a first metal patterns MP1, a second metal pattern MP2, and a fill metal pattern FMP that are sequentially stacked. A constituent and structure of the outer gate electrode OGE on the NMOSFET region NR may be substantially the same as that of the outer gate electrode OGE on the PMOSFET region PR. Thus, other descriptions of the outer gate electrode OGE on the NMOSFET region NR may be substantially the same as the aforementioned descriptions of the outer gate electrode OGE on the PMOSFET region PR.

A semiconductor device according to the present embodiment may be configured such that a material of the inner gate electrode IGEa in the first fin structure FST1 and a material of the inner gate electrode IGEb in the second fin structure FST2 may be adjusted differently from each other to allow PMOS and NMOS field effect transistors to have their work functions different from each other. According to the present embodiment, even when the PMOS and NMOS field effect transistors share the same outer gate electrode OGE, the PMOS and NMOS field effect transistors may be controlled to have their own proper work function.

According to the present inventive concepts, there may be no difference between the PMOSFET and NMOSFET regions PR and NR when the outer gate electrode OGE is formed, and thus it may be possible to reduce process difficulty and to increase device reliability. Moreover, the PMOS and NMOS field effect transistors may simply achieve their desired work functions by controlling only materials of the inner gate electrodes IGEa and IGEb respectively on the PMOSFET and NMOSFET regions PR and NR.

FIGS. 5A to 10D illustrate cross-sectional views showing a method of fabricating a semiconductor device according to some embodiments of the present inventive concepts. In detail, FIGS. 5A, 6A, 7A, 8A, 9A, and 10A illustrate cross-sectional views taken along line A-A' of FIG. 1. FIGS. 7B, 8B, 9B, and 10B illustrate cross-sectional views taken along line B-B' of FIG. 1. FIGS. 7C, 8C, 9C, and 10C illustrate cross-sectional views taken along line C-C' of FIG. 1. FIGS. 5B, 6B, 7D, 8D, 9D, and 10D illustrate cross-sectional views taken along line D-D' of FIG. 1.

Figure 5A:
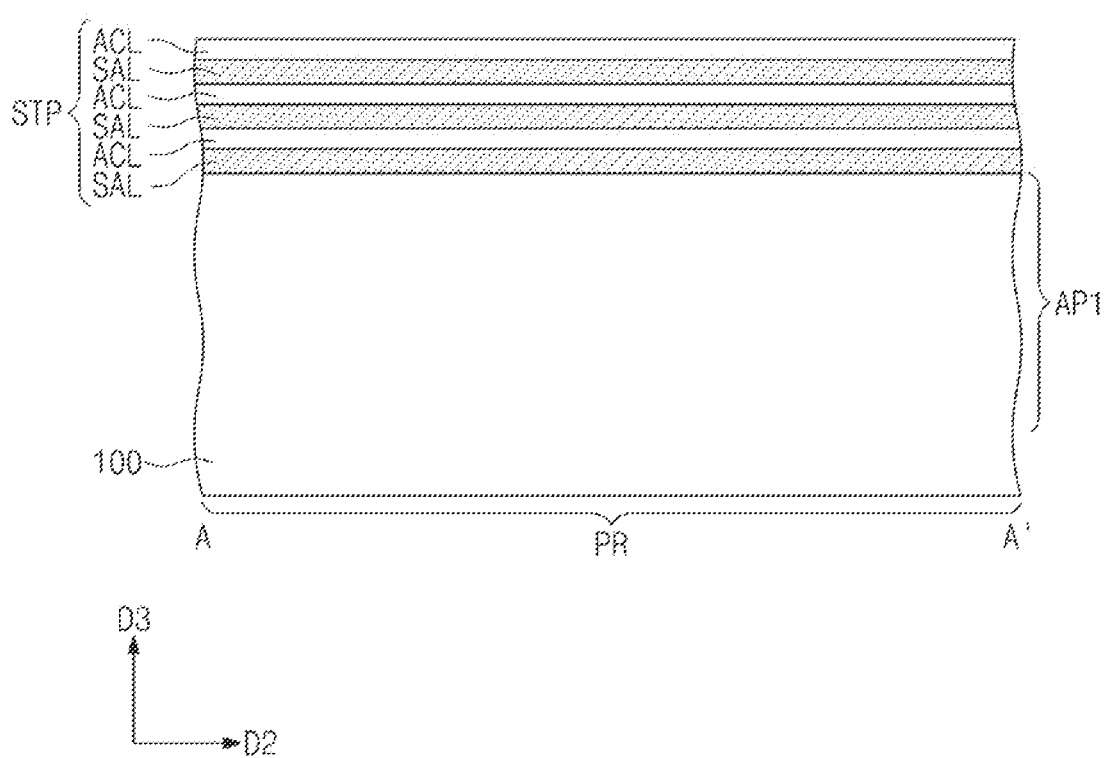
FIGS. 5A-5B, 6A-6B, 7A-7D, 8A-8D, 9A-9D, and 10A-10D illustrate cross-sectional views showing a method of fabricating a semiconductor device, according to example embodiments of the present inventive concepts.
Figure 5B:
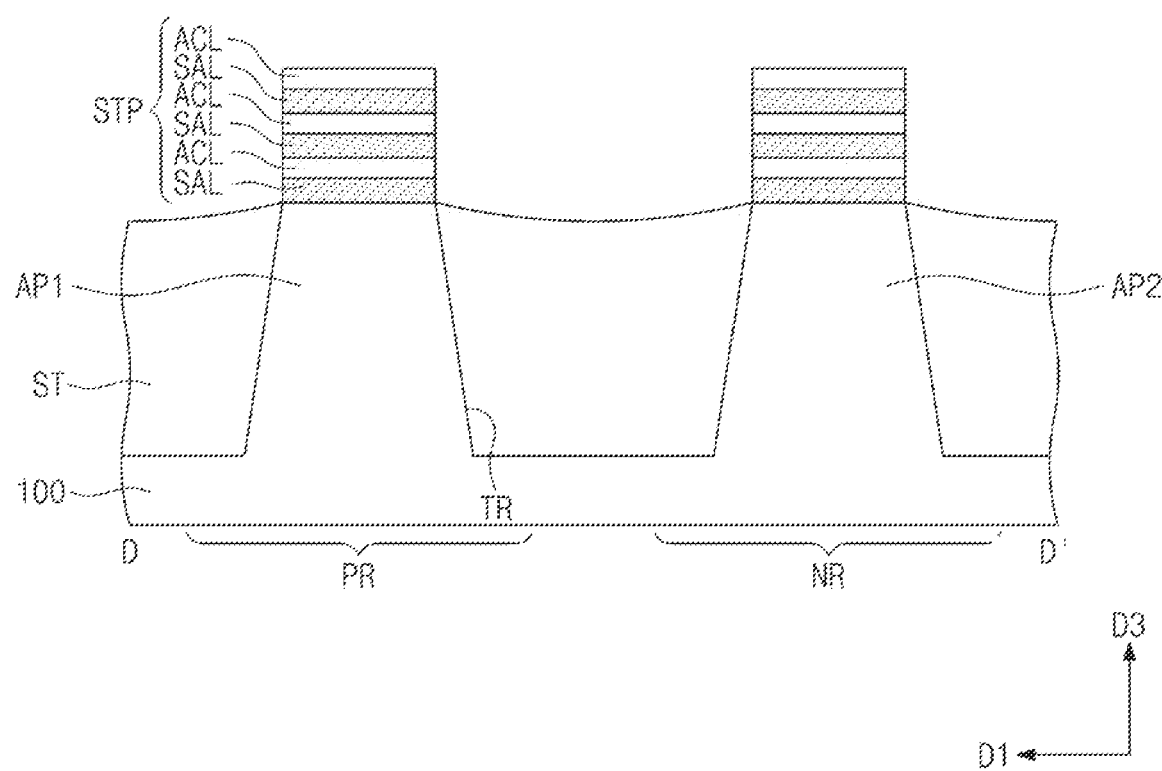

Referring to FIGS. 5A and 5B, a substrate 100 may be provided which includes a PMOSFET region PR and an NMOSFET region NR. Sacrificial layers SAL and active layers ACL may be alternately formed and stacked on the substrate 100. The sacrificial layers SAL may include one of silicon (Si), germanium (Ge), and silicon-germanium (SiGe), and the active layers ACL may include another of silicon (Si), germanium (Ge), and silicon-germanium (SiGe).

For example, the sacrificial layers SAL may include silicon-germanium (SiGe), and the active layers ACL may include silicon (Si). Each of the sacrificial layers SAL may have a germanium concentration of about 10 at % to about 30 at %.

Mask patterns may be correspondingly formed on the PMOSFET and NMOSFET regions PR and NR of the substrate 100. The mask pattern may have a linear or bar shape that extends lengthwise in a second direction D2.

A patterning process may be performed in which the mask patterns are used as an etching mask to form a trench TR that defines a first active pattern AP1 and a second active pattern AP2. The first active pattern AP1 and the second active pattern AP2 may be respectively formed on the PMOSFET region PR and the NMOSFET region NR. A stack pattern STP may be formed on each of the first and second active patterns AP1 and AP2. The stack pattern STP may include the sacrificial layers SAL and the active layers ACL that are alternately stacked. During the patterning process, the stack pattern STP may be formed together with the first and second active patterns AP1 and AP2.

A device isolation layer ST may be formed to fill the trench TR. For example, a dielectric layer may be formed on an entire surface of the substrate 100 to cover the stack patterns STP and the first and second active patterns AP1 and AP2. The dielectric layer may be recessed until the stack patterns STP are exposed, thereby forming the device isolation layer ST.

The device isolation layer ST may include a dielectric material, such as a silicon oxide layer. The stack patterns STP may upwardly protrude from the device isolation layer ST. For example, the stack patterns STP may vertically protrude upwardly from the device isolation layer ST.

Figure 6A:
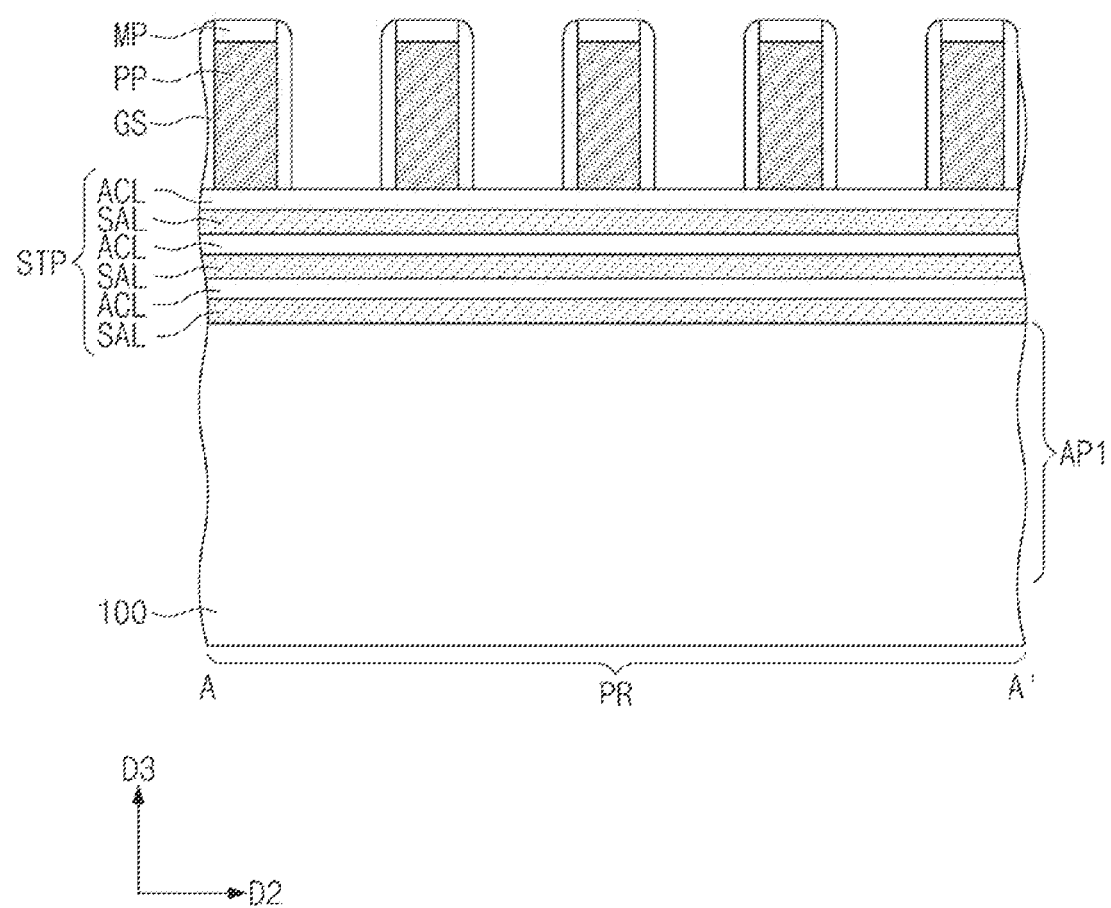
Figure 6B:
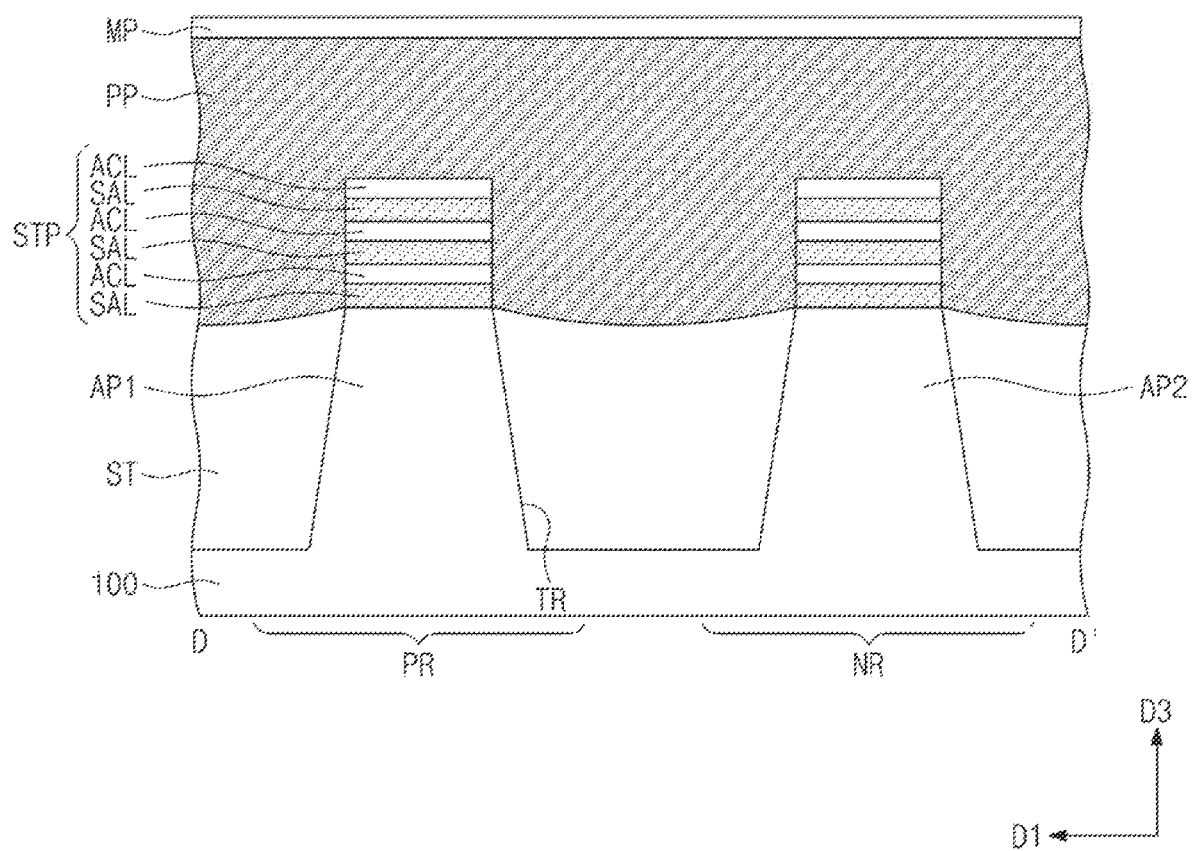
Figure 7A:
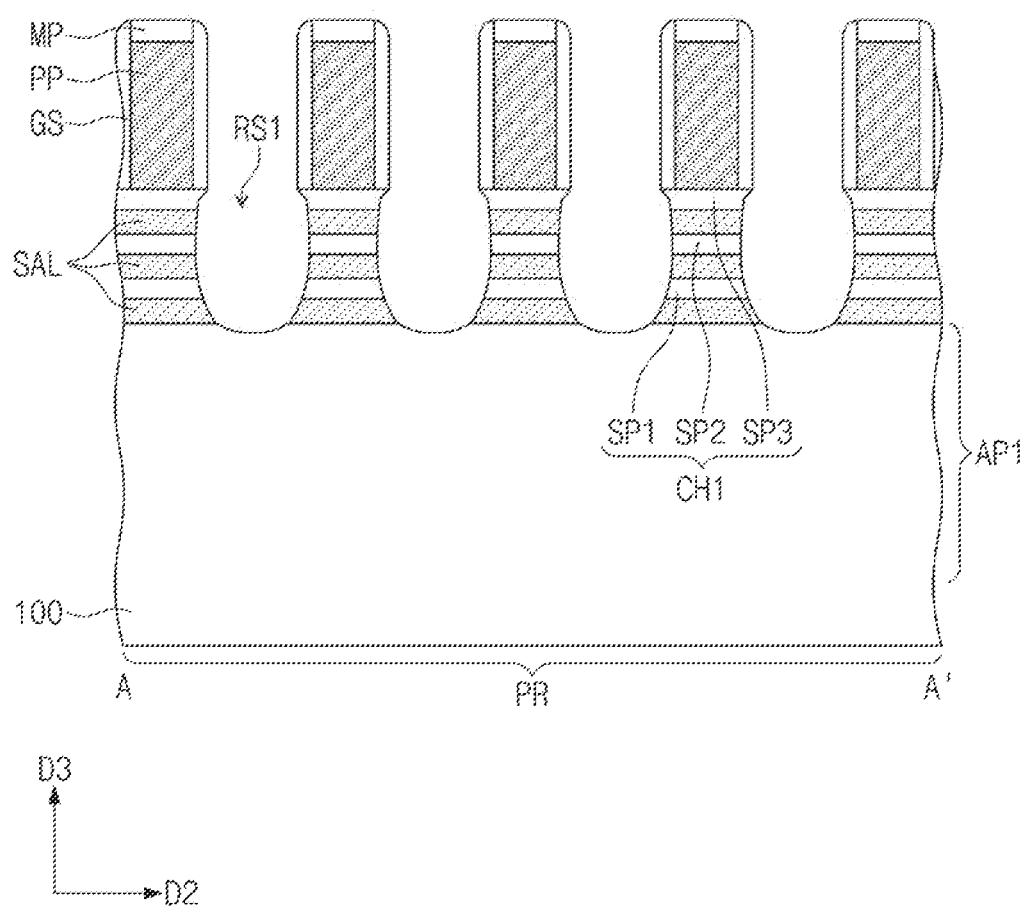
Figure 7B:
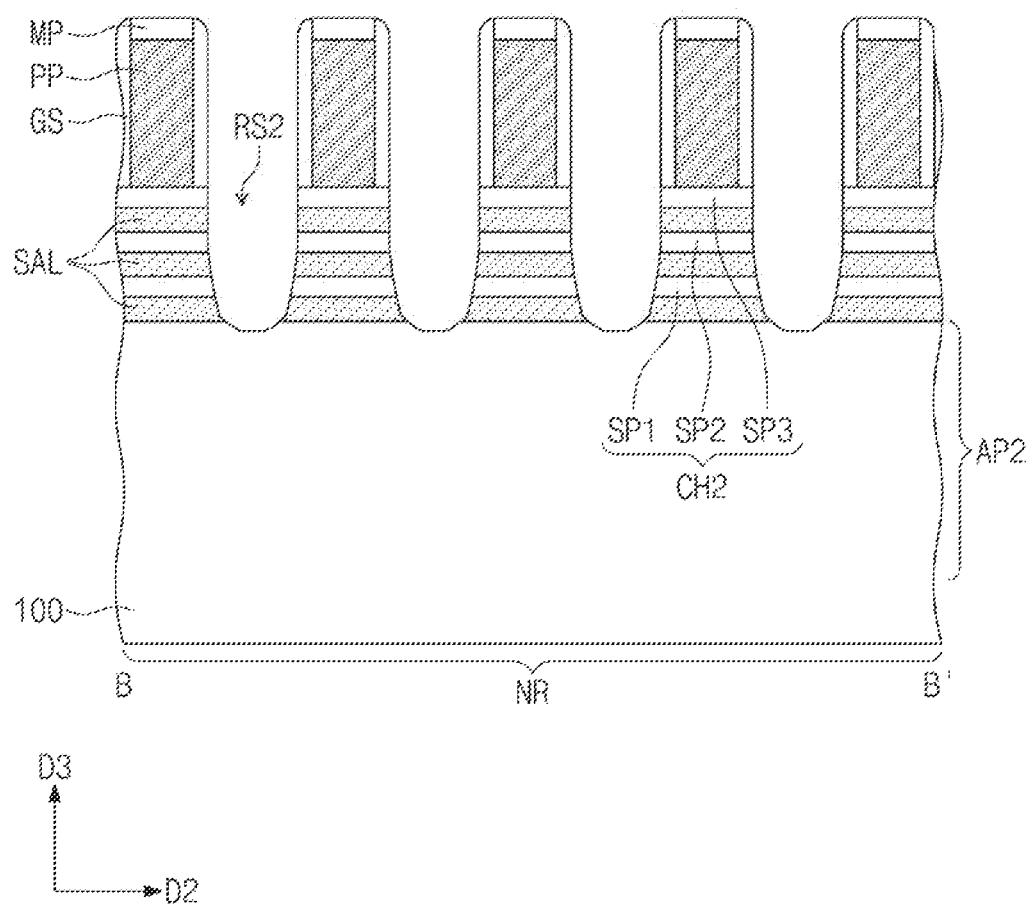
Figure 7C:
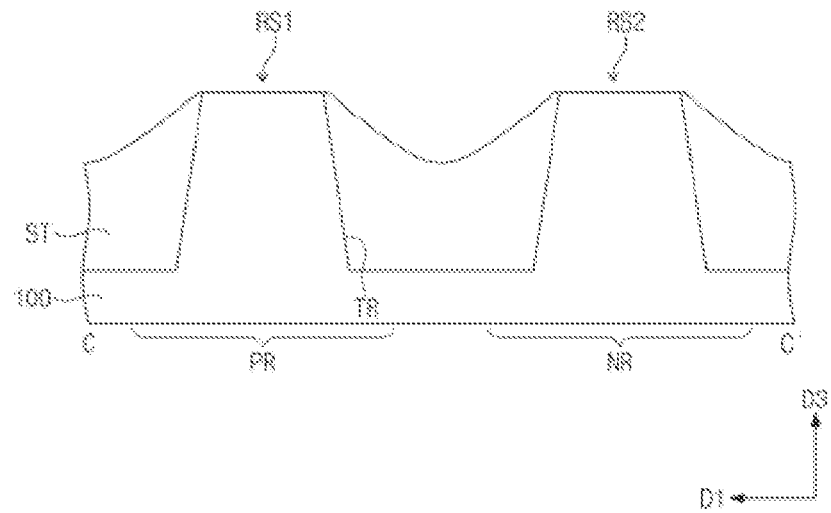
Figure 7D:
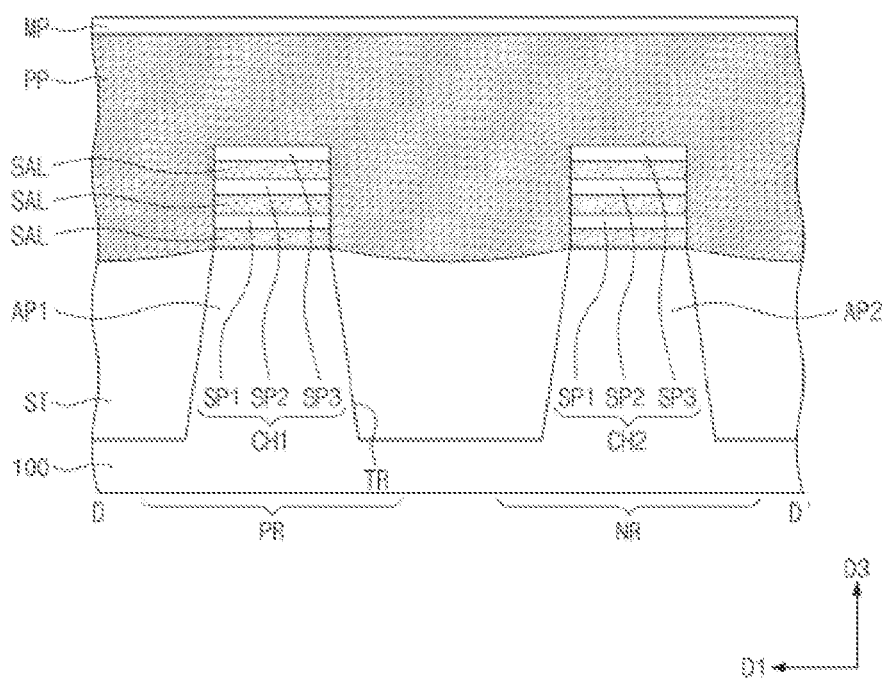
Figure 8A:
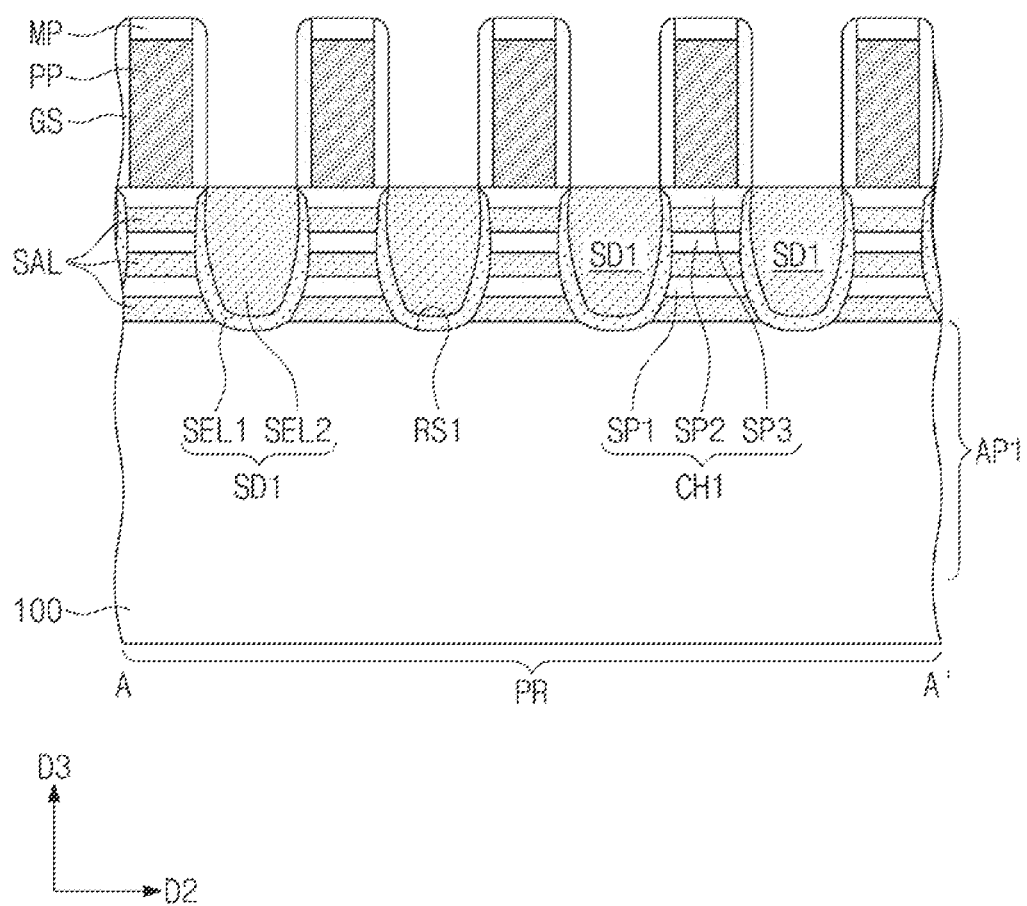
Figure 8B:
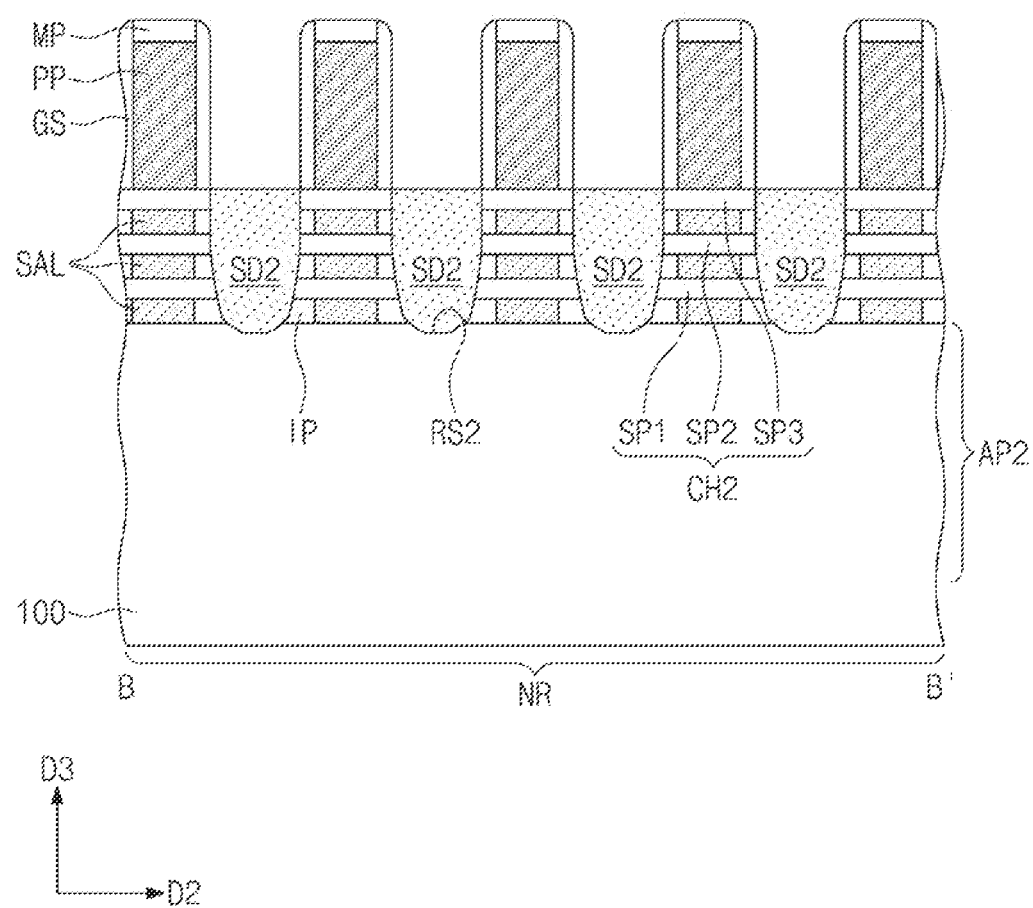
Figure 8C:
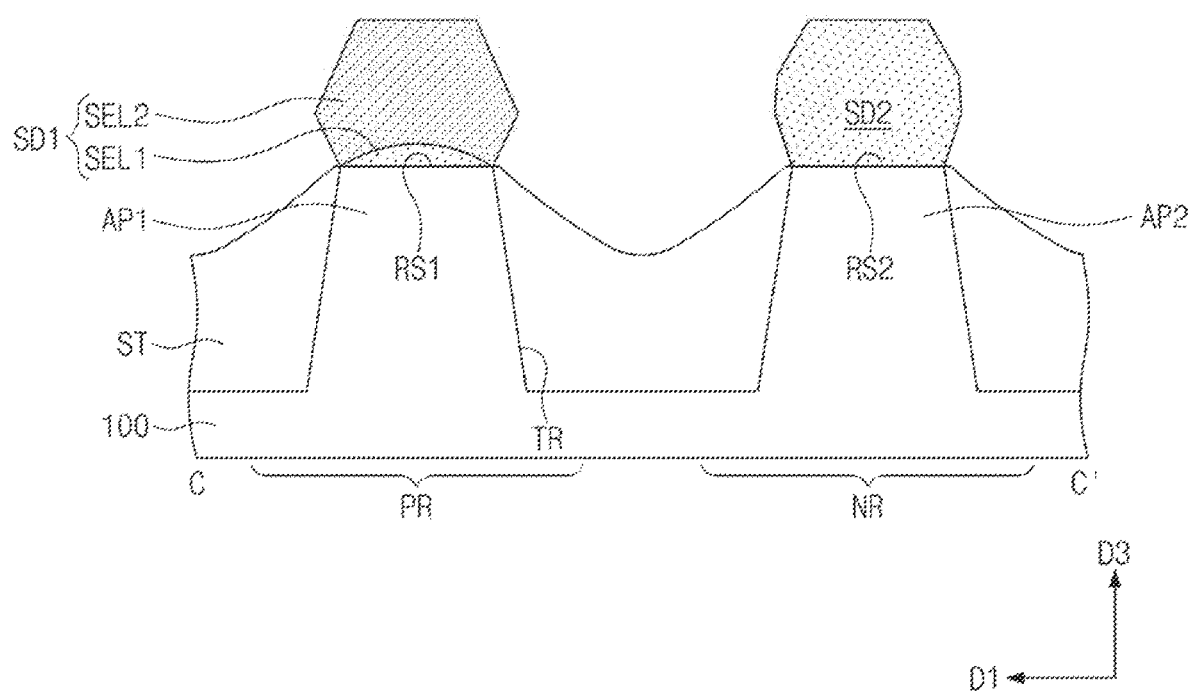
Figure 8D:
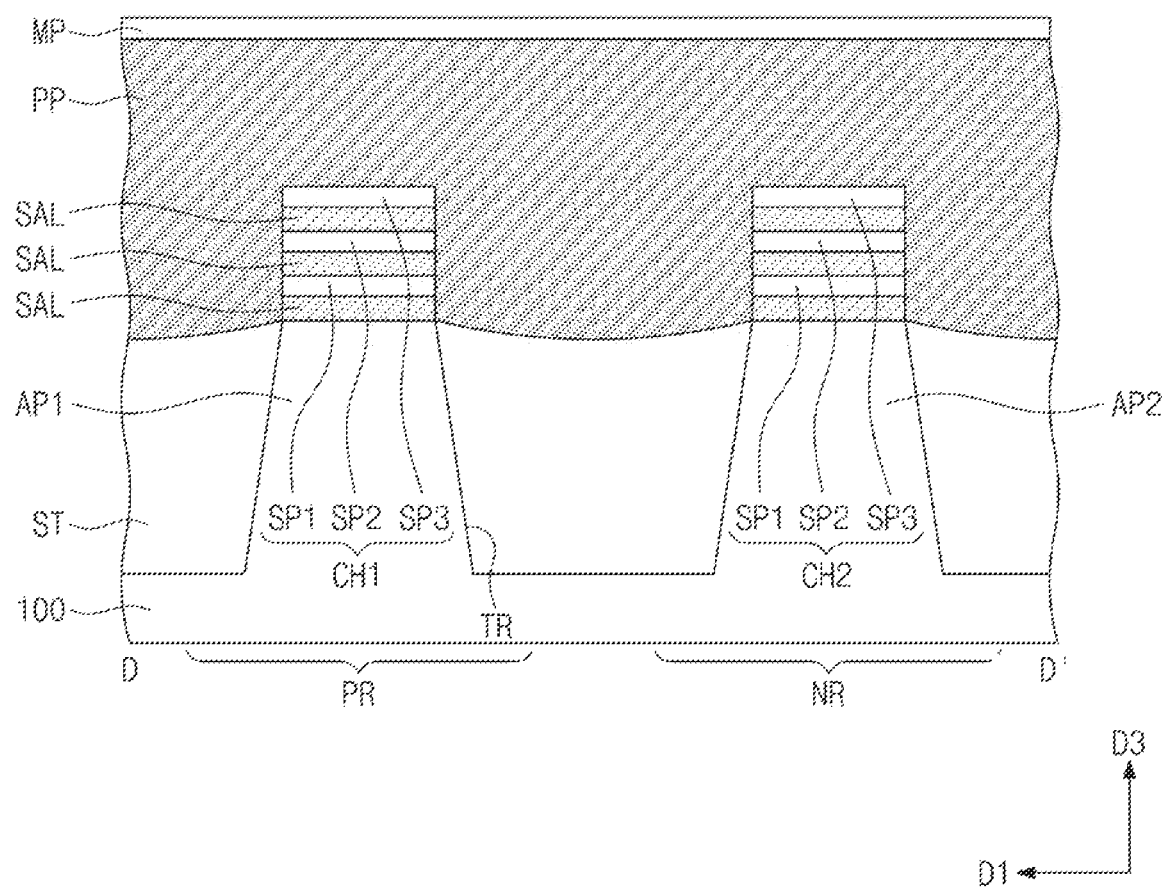

Referring to FIGS. 6A and 6B, sacrificial patterns PP may be formed on the substrate 100 to run across the stack patterns STP. Each of the sacrificial patterns PP may be formed to have a linear or bar shape that extends lengthwise in a first direction D1. The sacrificial patterns PP may be arranged at a certain pitch along the second direction D2.

For example, the formation of the sacrificial patterns PP may include forming a sacrificial layer on the entire surface of the substrate 100, forming hardmask patterns MP on the sacrificial layer, and using the hardmask patterns MP as an etching mask to pattern the sacrificial layer. The sacrificial layer may include polysilicon.

A pair of gate spacers GS may be formed on opposite sidewalls of each of the sacrificial patterns PP. The formation of the gate spacers GS may include conformally forming a gate spacer layer on the entire surface of the substrate 100 and anisotropically etching the gate spacer layer. The gate spacer layer may include at least one selected from SiCN, SiCON, and SiN. Alternatively, the gate spacer layer may be a multi-layer including at least two selected from SiCN, SiCON, and SiN.

Referring to FIGS. 7A to 7D, first recessions RS1 may be formed in the stack pattern STP on the first active pattern AP1. Second recessions RS2 may be formed in the stack pattern STP on the second active pattern AP2. During the formation of the first and second recessions RS1 and RS2, the device isolation layer ST may further be recessed on opposite sides of each of the first and second active patterns AP1 and AP2 (see FIG. 7C).

For example, the hardmask patterns MP and the gate spacers GS may be used as an etching mask such that the stack pattern STP on the first active pattern AP1 may be etched to form the first recessions RS1. Each first recession RS1 may be formed between a pair of sacrificial patterns PP. The second recessions RS2 in the stack pattern STP on the second active pattern AP2 may be formed by a method the same as the formation of the first recessions RS1. For example, the hardmask patterns MP and the gate spacers GS may be used as an etching mask such that the stack pattern STP on the second active pattern AP2 may be etched to form the second recessions RS2. Each second recession RS2 may be formed between a pair of sacrificial patterns PP.

The first, second, and third semiconductor patterns SP1, SP2, and SP3 may be formed from the active layers ACL that are sequentially stacked between neighboring first recessions RS1. The first, second, and third semiconductor patterns SP1, SP2, and SP3 may be formed from the active layers ACL that are sequentially stacked between neighboring second recessions RS2. A first channel pattern CH1 may be constituted by the first, second, and third semiconductor patterns SP1, SP2, and SP3 between neighboring first recessions RS1. A second channel pattern CH2 may be constituted by the first, second, and third semiconductor patterns SP1, SP2, and SP3 between neighboring second recessions RS2.

Referring to FIGS. 8A to 8D, first source/drain patterns SD1 may be formed in corresponding first recessions RS1. For example, a first selective epitaxial growth (SEG) process may be performed in which an inner wall of the first recession RS1 is used as a seed layer to form a first semiconductor layer SEL1. The first, second, and third semiconductor patterns SP1, SP2, and SP3 and the substrate 100 that are exposed to the first recession RS1 may be used as a seed from which the semiconductor layer SEL1 is grown. For example, the first SEG process may include chemical vapor deposition (CVD) or molecular beam epitaxy (MBE).

The first semiconductor layer SEL1 may include a semiconductor element (e.g., SiGe) of which a lattice constant is greater than that of a semiconductor element included in the substrate 100. The first semiconductor layer SEL1 may contain germanium (Ge) of which a concentration is relatively low. In some embodiments of the present inventive concepts, the first semiconductor layer SEL1 may include only silicon (Si) rather than germanium (Ge). The first semiconductor layer SEL1 may have a germanium concentration of about 0 at % to about 10 at %.

The first semiconductor layer SEL1 may undergo a second selective epitaxial growth (SEG) process to form a second semiconductor layer SEL2. The second semiconductor layer SEL2 may be formed to completely fill the first recession RS1. The second semiconductor layer SEL2 may contain germanium (Ge) of which concentration is relatively high. For example, the second semiconductor layer SEL2 may have a germanium concentration of about 30 at % to about 75 at %.

The first semiconductor layer SEL1 and the second semiconductor layer SEL2 may constitute the first source/drain pattern SD1. Impurities may be in-situ implanted during the first and second SEG processes. For another example, after the first source/drain pattern SD1 is formed, impurities may be implanted into the first source/drain pattern SD1. The first source/drain pattern SD1 may be doped to have a first conductivity type (e.g., p-type).

Second source/drain patterns SD2 may be formed in corresponding second recessions RS2. For example, a selective epitaxial growth (SEG) process may be performed in which an inner wall of the second recession RS2 is used as a seed to form the second source/drain pattern SD2. For example, the second source/drain pattern SD2 may include the same semiconductor element (e.g., Si) as that of the substrate 100. The second source/drain pattern SD2 may be doped to have a second conductivity type (e.g., n-type). Inner spacers IP may be correspondingly formed between the second source/drain pattern SD2 and the sacrificial layers SAL.

Referring to FIGS. 9A to 9D, a first interlayer dielectric layer 110 may be formed to cover the first and second source/drain patterns SD1 and SD2, the hardmask patterns MP, and the gate spacers GS. For example, the first interlayer dielectric layer 110 may include a silicon oxide layer.

The first interlayer dielectric layer 110 may be planarized until top surfaces of the sacrificial patterns PP are exposed. An etch-back or chemical mechanical polishing (CMP) process may be employed to planarize the first interlayer dielectric layer 110. The hardmask patterns MP may all be removed during the planarization process. As a result, the first interlayer dielectric layer 110 may have a top surface coplanar with those of the sacrificial patterns PP and those of the gate spacers GS.

The exposed sacrificial patterns PP may be selectively removed. The removal of the sacrificial patterns PP may form outer areas ORG that expose the first and second channel patterns CH1 and CH2 (see FIG. 9D).

Figure 9A:
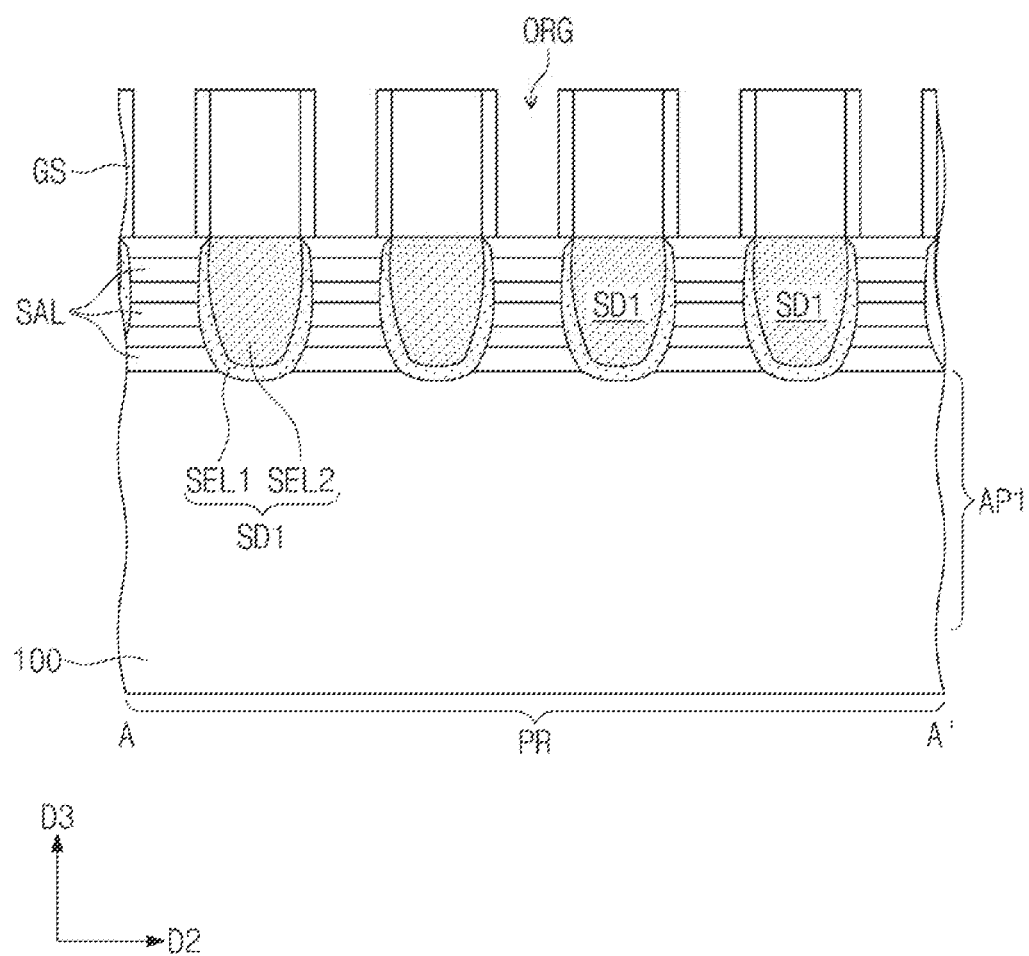
Figure 9B:
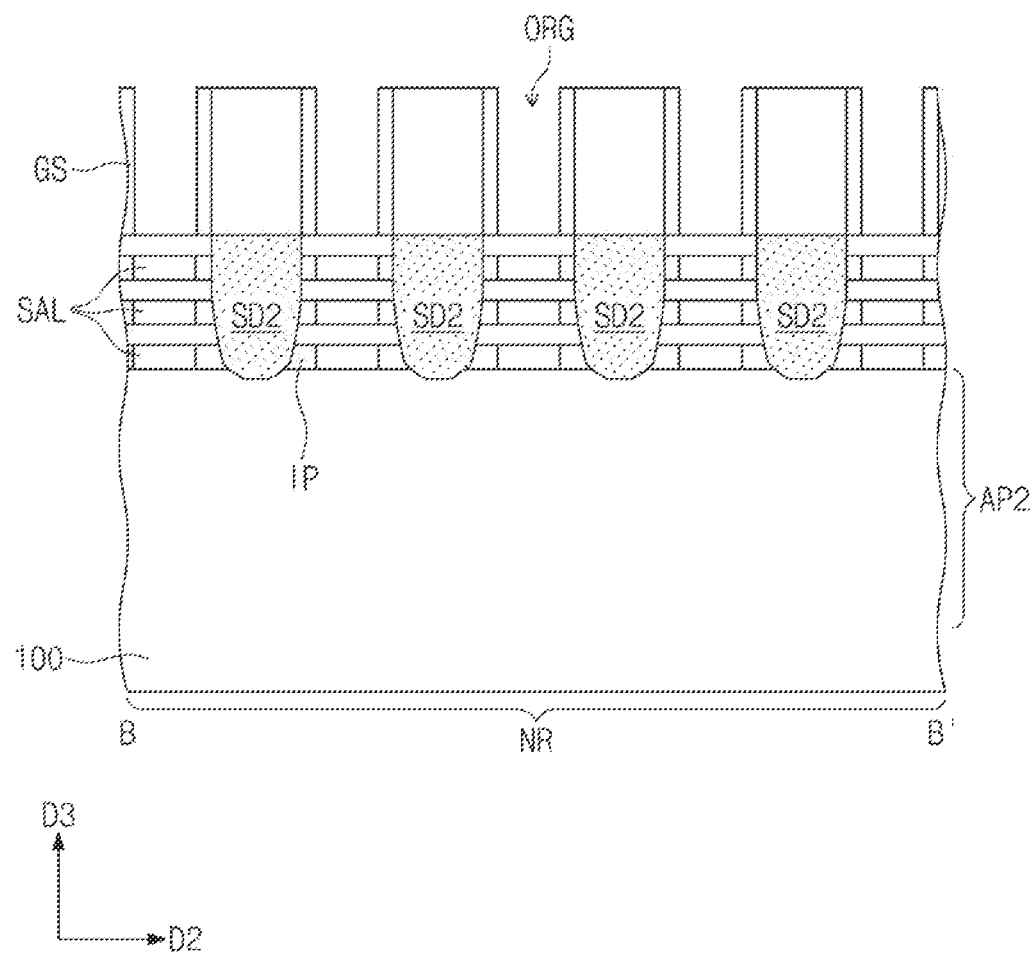
Figure 9C:
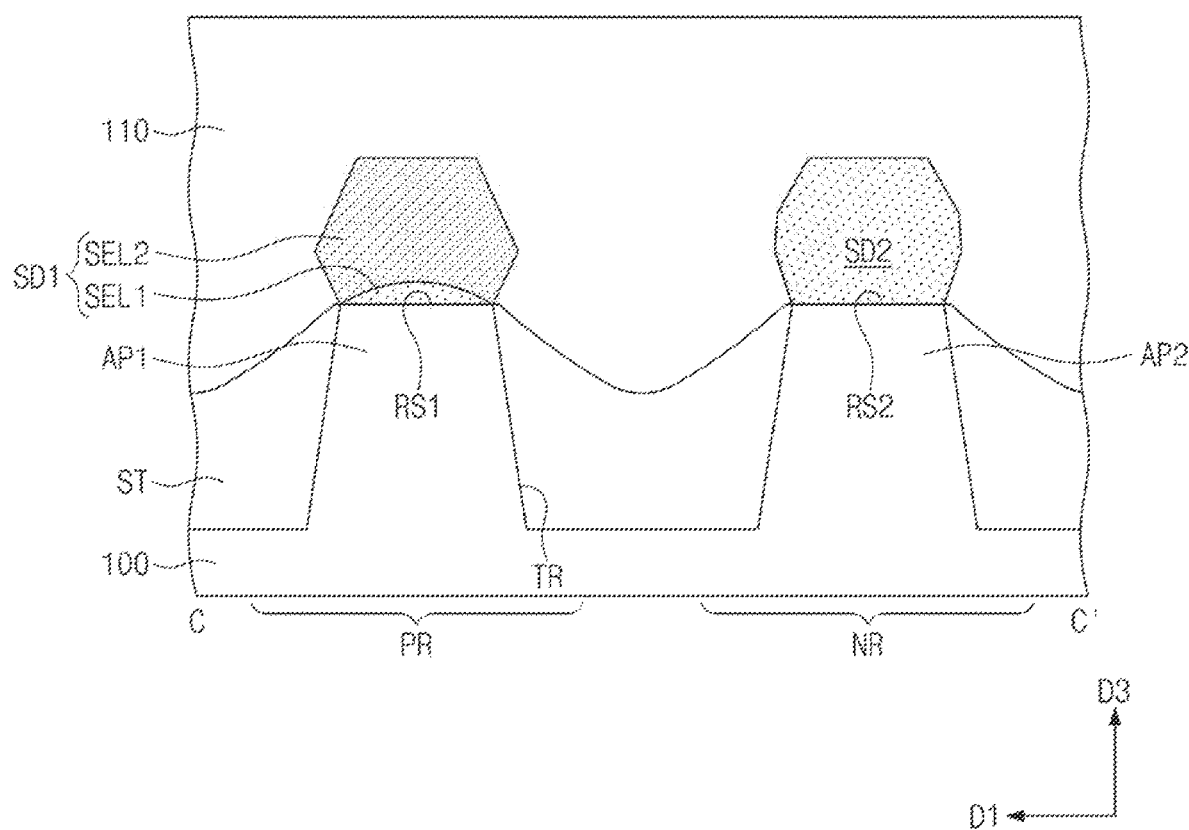
Figure 9D:
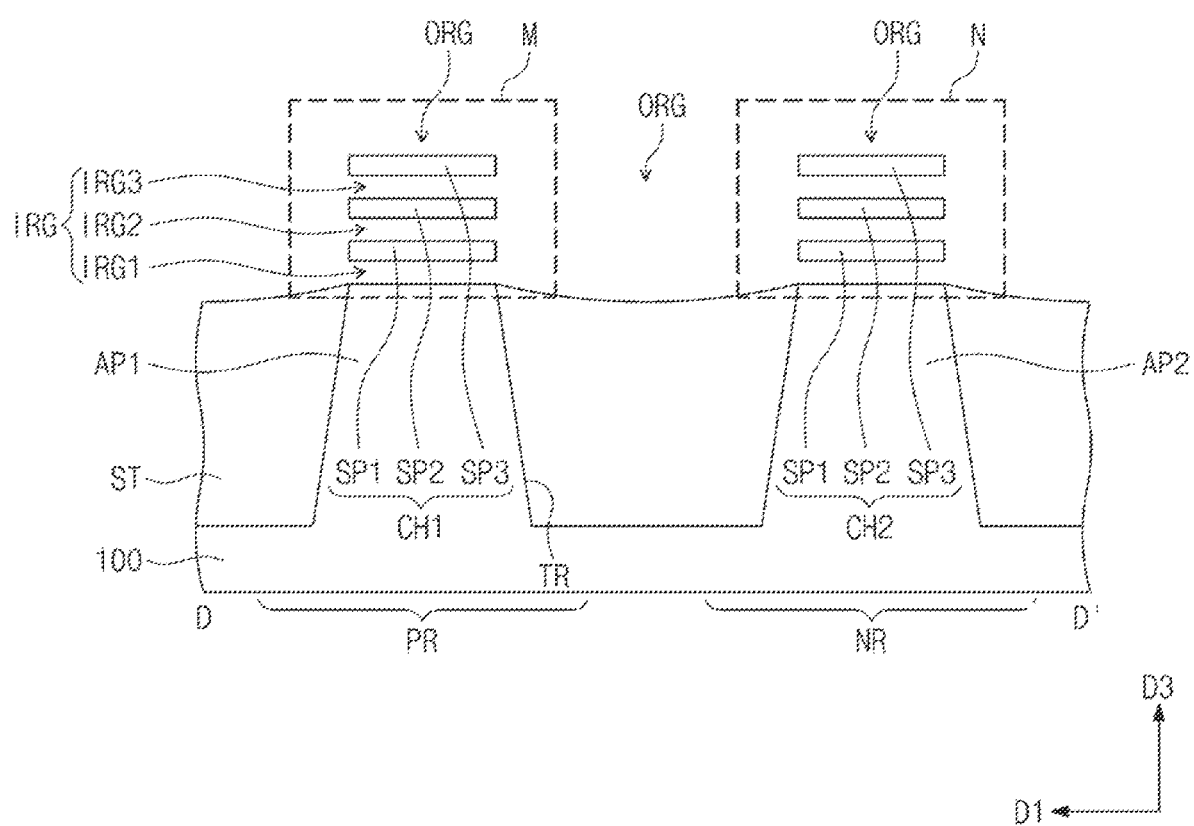

The sacrificial layers SAL exposed to the outer area ORG may be selectively removed to form inner areas IRG (see FIG. 9D). For example, an etching process that selectively etches the sacrificial layers SAL may be performed such that the sacrificial layers SAL may be removed, and that the first, second, and third semiconductor patterns SP1, SP2, and SP3 may remain without being removed. The etching process may have a high etch rate for silicon-germanium of which germanium concentration is relatively high. For example, the etching process may have a high etch rate for silicon-germanium of which germanium concentration is greater than about 10 at %.

During the etching process, the sacrificial layers SAL may be removed from the PMOSFET region PR and the NMOSFET region NR. The etching process may be a wet etching process. An etching material used for the etching process may promptly etch the sacrificial layer SAL of which germanium concentrate is relatively high. During the etching process, the first source/drain pattern SD1 on the PMOSFET region PR may be protected by the first semiconductor layer SEL1 of which germanium concentration is relatively low.

Referring back to FIG. 9D, as the sacrificial layers SAL are selectively removed, the stacked first, second, and third semiconductor patterns SP1, SP2, and SP3 may remain on each of the first and second active patterns AP1 and AP2. The removal of the sacrificial layers SAL may form first, second, and third inner areas IRG1, IRG3, and IRG3.

For example, the first inner area IRG1 may be formed between the active pattern AP1 or AP2 and the first semiconductor pattern SP1, the second inner area IRG2 may be formed between the first semiconductor pattern SP1 and the second semiconductor pattern SP2, and the third inner area IRG3 may be formed between the second semiconductor pattern SP2 and the third semiconductor pattern SP3.

Referring to FIGS. 10A to 10D, a gate dielectric layer GI may be conformally formed on the first, second, and third semiconductor patterns SP1, SP2, and SP3 that are exposed. First, second, and third inner gate electrodes IGE1, IGE2, and IGE3 may be respectively formed in the first, second, and third inner areas IRG1, IRG2, and IRG3 on the PMOSFET region PR. First, second, and third inner gate electrodes IGE1, IGE2, and IGE3 may be respectively formed in the first, second, and third inner areas IRG1, IRG2, and IRG3 on the NMOSFET region NR. The first, second, and third inner gate electrodes IGE1, IGE2, and IGE3 may constitute either an inner gate electrode IGEa on the PMOSFET region PR or an inner gate electrode IGEb on the NMOSFET region NR.

An outer gate electrode OGE may be formed in the outer area ORG. A gate electrode GE may be constituted by the inner gate electrode IGEa or IGEb and the outer gate electrode OGE. A gate capping pattern GP may be formed on the gate electrode GE.

Referring back to FIGS. 1 and 2A to 2D, a second interlayer dielectric layer 120 may be formed on the first interlayer dielectric layer 110. The second interlayer dielectric layer 120 may include a silicon oxide layer. Active contacts AC may be formed to penetrate the second and first interlayer dielectric layers 120 and 110 and to electrically connect with the first and second source/drain patterns SD1 and SD2. A gate contact GC may be formed to penetrate the second interlayer dielectric layer 120 and the gate capping pattern GP and to electrically connect with the gate electrode GE.

A pair of separation structures DB may be formed on opposite sides of a logic cell LC. The separation structures DB may extend from the second interlayer dielectric layer 120 through the gate electrode GE into the active pattern AP1 or AP2. The separation structures DB may include a dielectric material, such as a silicon oxide layer or a silicon nitride layer.

A third interlayer dielectric layer 130 may be formed on the active contacts AC and the gate contacts GC. A first metal layer M1 may be formed in the third interlayer dielectric layer 130. A fourth interlayer dielectric layer 140 may be formed on the third interlayer dielectric layer 130. A second metal layer M2 may be formed in the fourth interlayer dielectric layer 140.

Figure 10A:
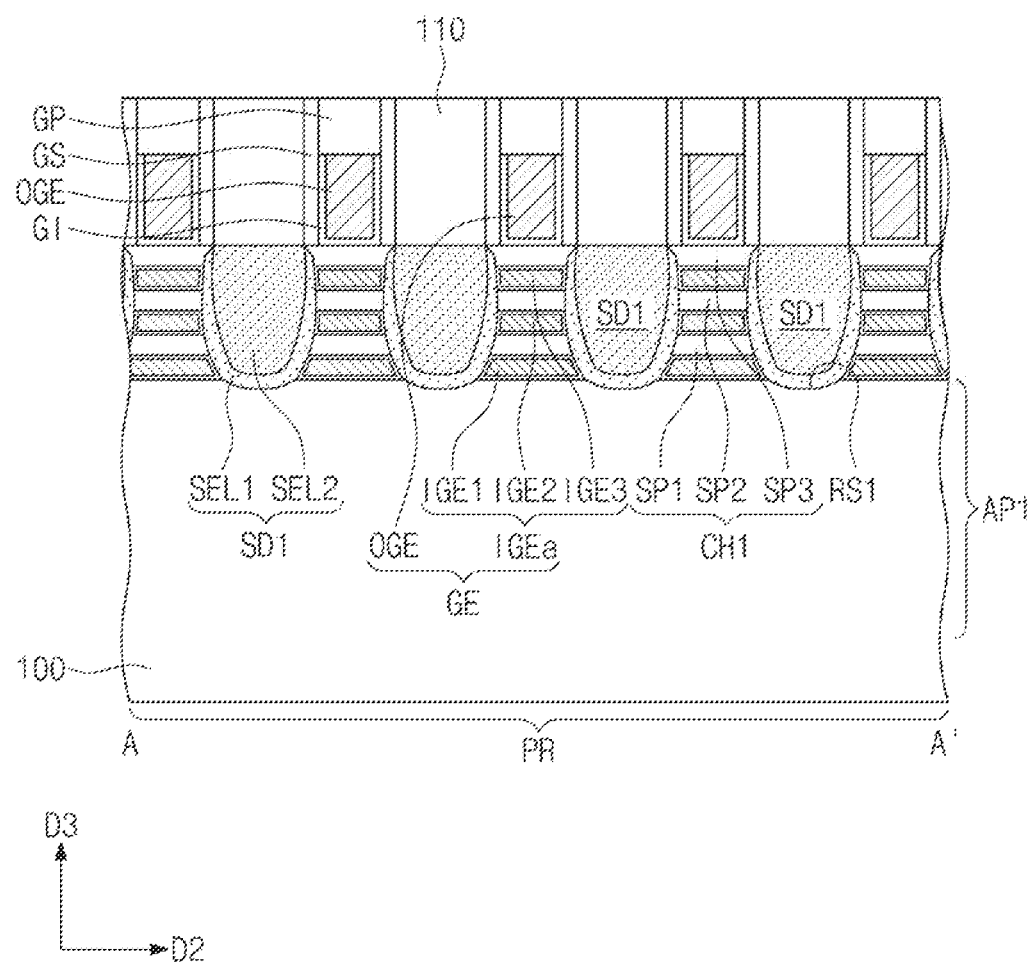
Figure 10B:
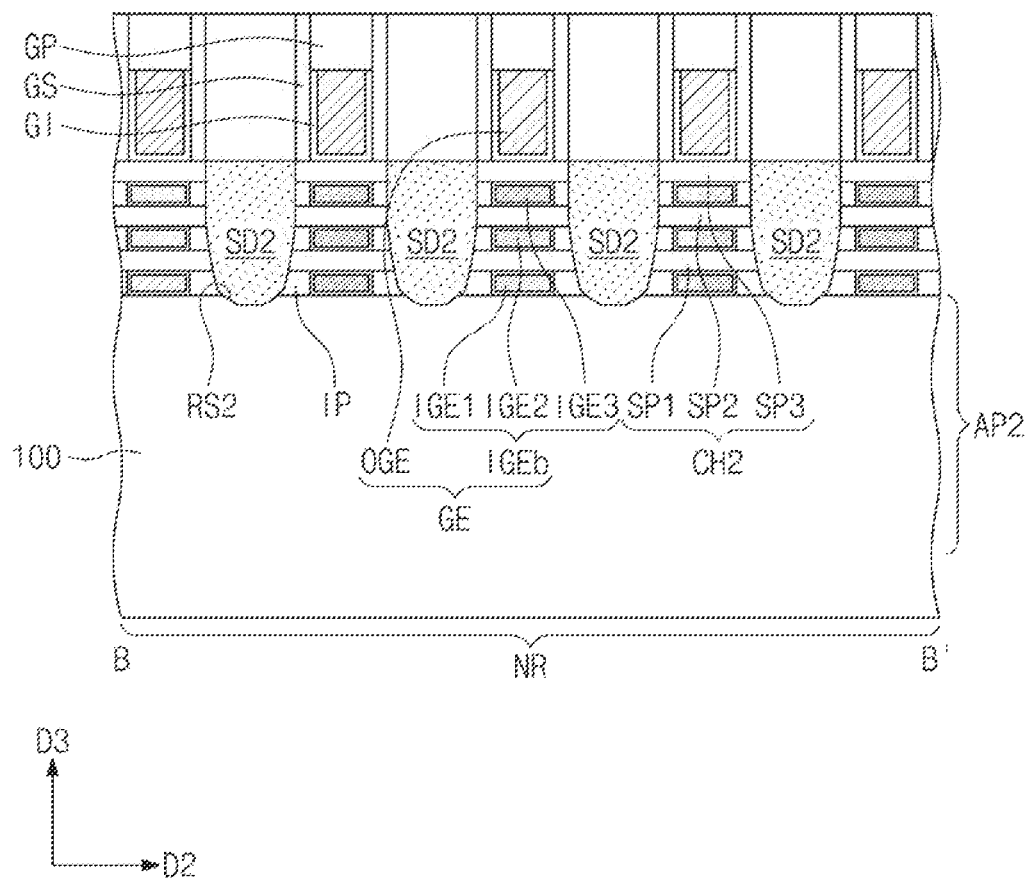
Figure 10C:
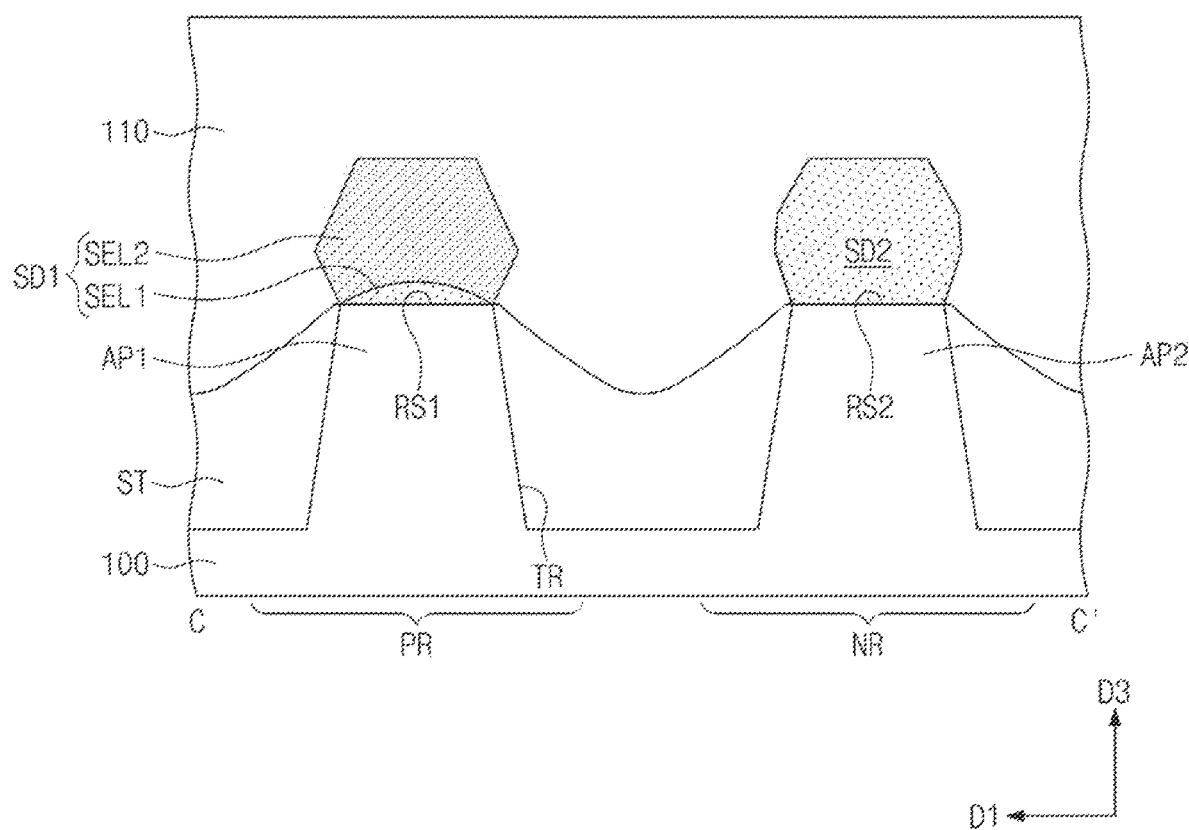
Figure 10D:
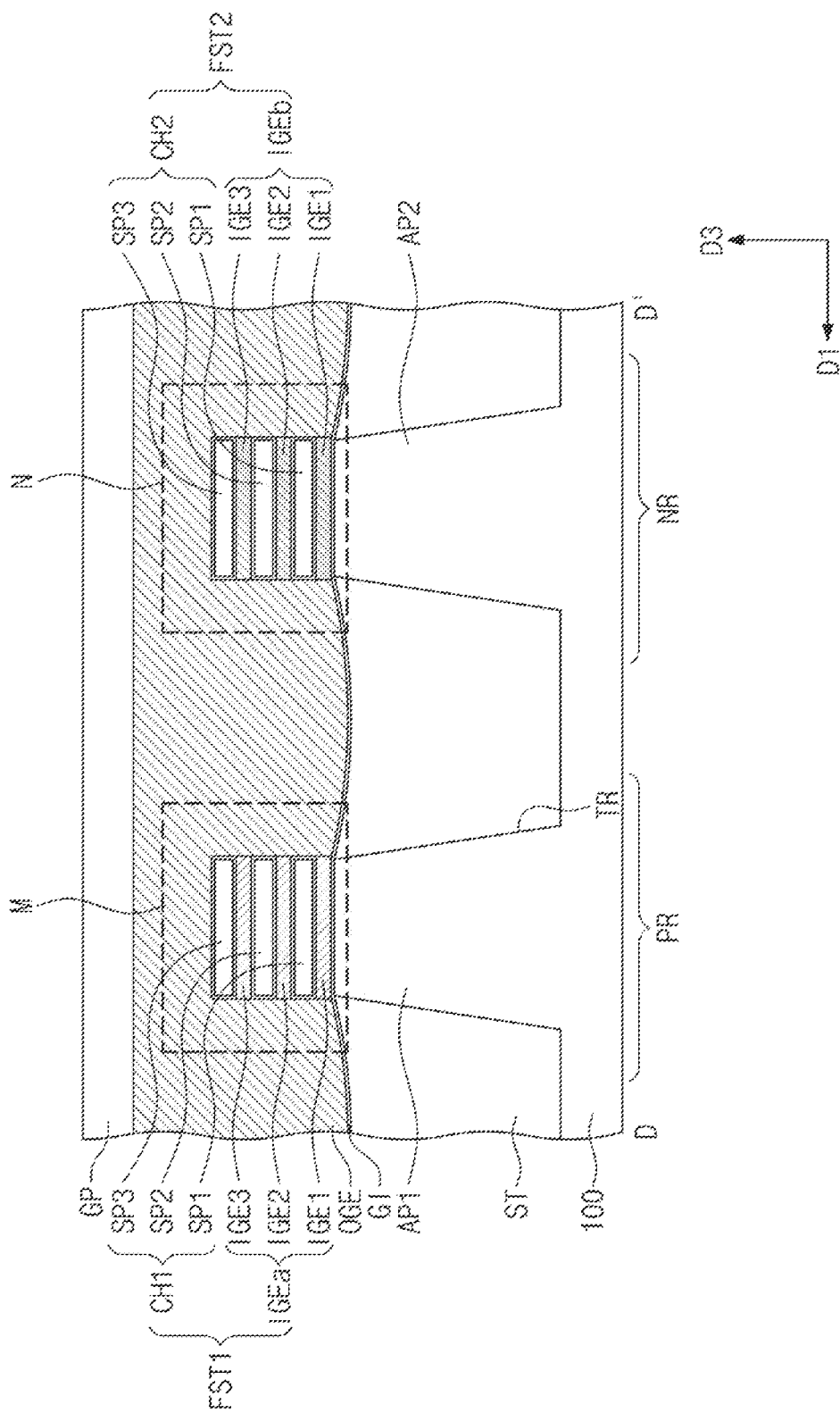

FIGS. 11A, 12A, 13A, 14A and 15A illustrate enlarged cross-sectional views of section M of FIGS. 9D and 10D, showing a method of forming a gate electrode on a PMOSFET region according to some embodiments of the present inventive concepts. FIGS. 11B, 12B, 13B, 14B, and 15B illustrate enlarged cross-sectional views of section N depicted in FIGS. 9D and 10D, showing a method of forming a gate electrode on an NMOSFET region according to some embodiments of the present inventive concepts.

Figure 11A:
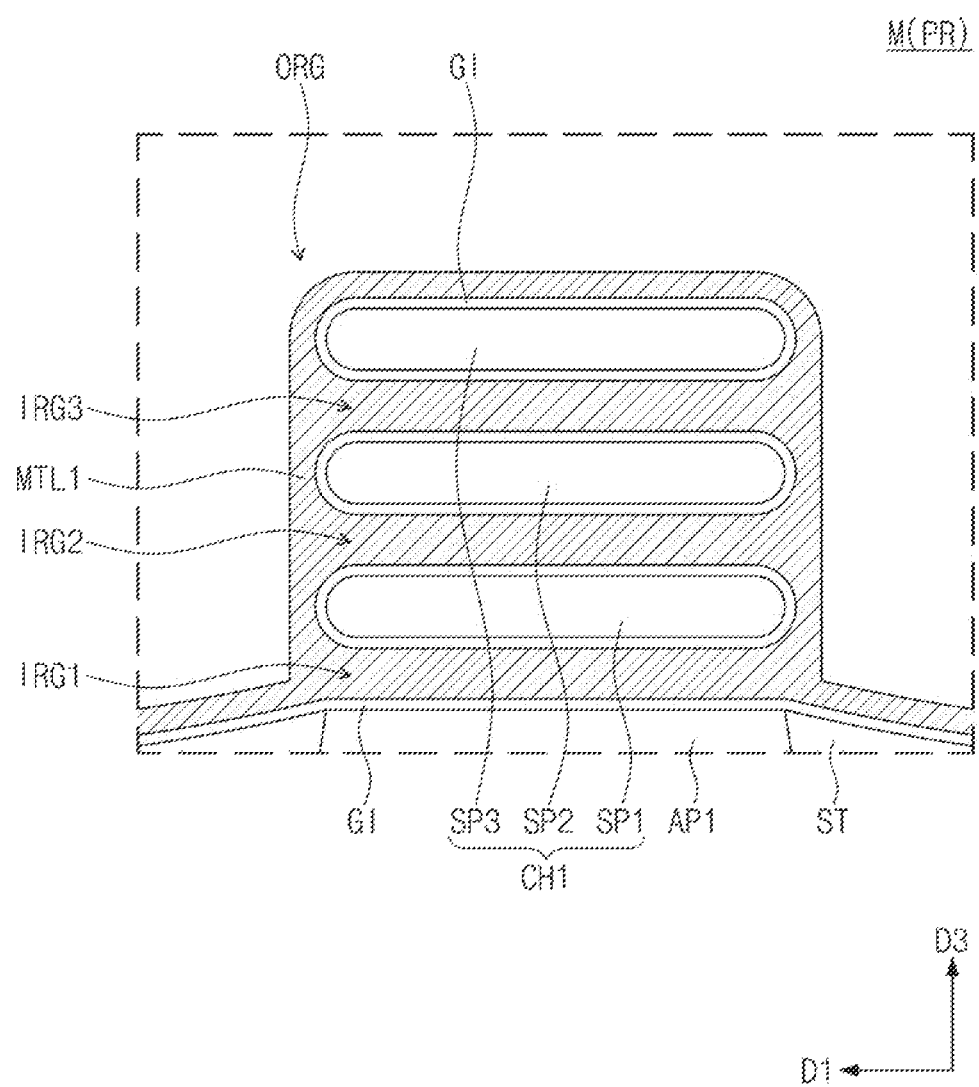
FIGS. 11A, 12A, 13A, 14A, and 15A illustrate enlarged cross-sectional views of section M depicted in FIGS. 9D and 10D, showing a method of forming a gate electrode on a PMOSFET region, according to example embodiments of the present inventive concepts.
Figure 11B:
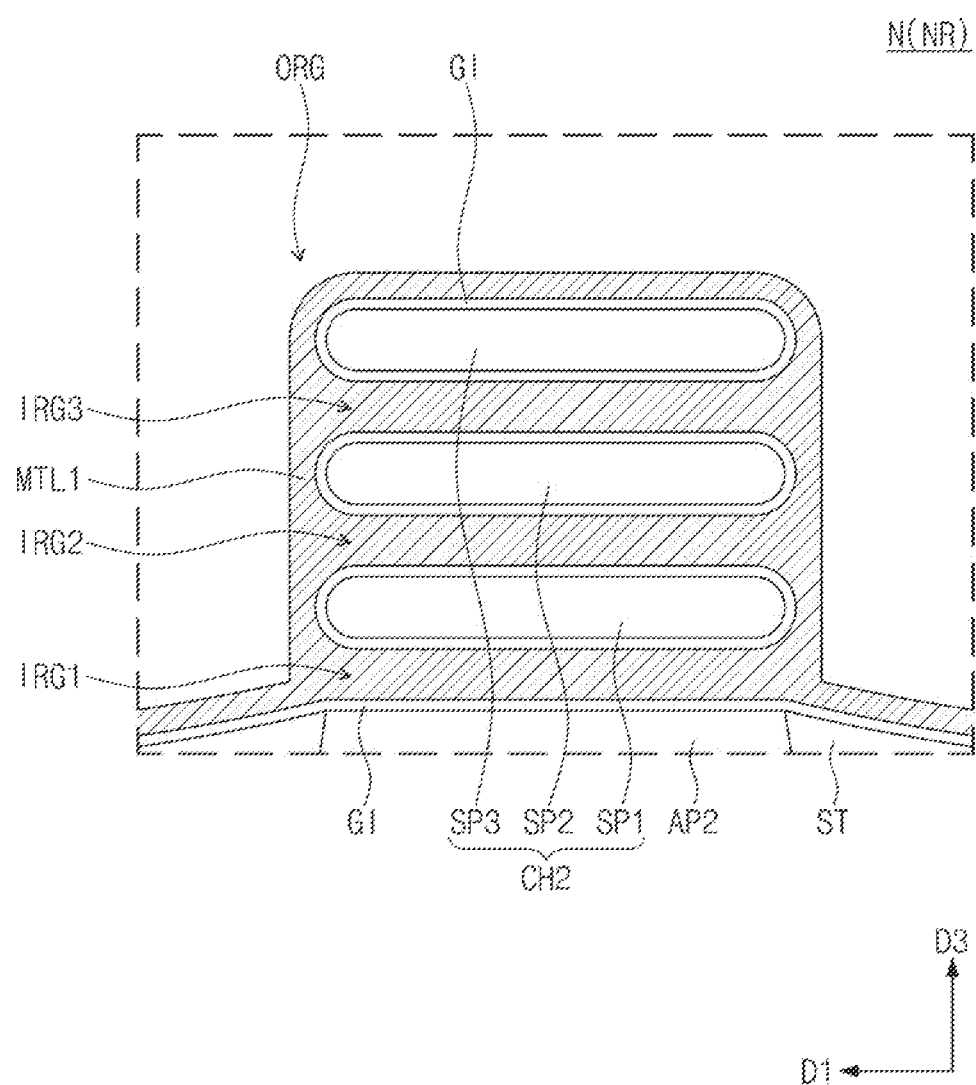
FIGS. 11B, 12B, 13B, 14B, and 15B illustrate enlarged cross-sectional views of section N depicted in FIGS. 9D and 10D, showing a method of forming a gate electrode on an NMOSFET region, according to example embodiments of the present inventive concepts.

Referring to FIGS. 11A and 11B, a first metal layer MTL1 may be formed in common on the first channel pattern CH1 and the second channel pattern CH2. The first metal layer MTL1 may be formed to completely fill the first, second, and third inner areas IRG1, IRG2, and IRG3. The first metal layer MTL1 may be formed to fill at least a portion of the outer area ORG. For example, the first metal layer MTL1 may be formed on side surfaces of the first, second, and third semiconductor patterns SP1, SP2, and SP3, and on top surfaces of the gate dielectric layer GI and the third semiconductor pattern SP3.

The first metal layer MTL1 may include a first workfunction metal. For example, the first metal layer MTL1 may include a p-type work-function metal of which a work function is relatively high. The first metal layer MTL1 may include nitrogen (N) and at least one metal selected from titanium (Ti), tantalum (Ta), aluminum (Al), tungsten (W), and molybdenum (Mo).

Figure 12A:
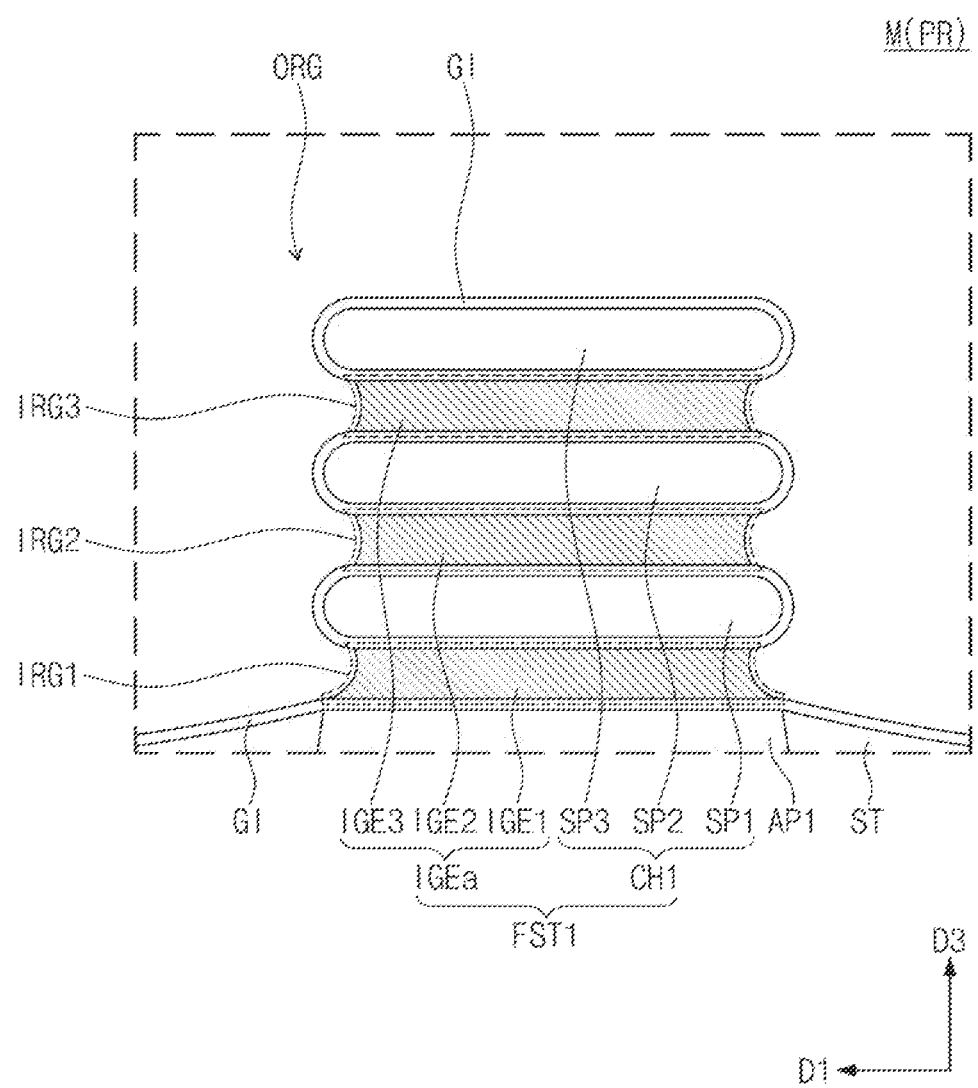
Figure 12B:
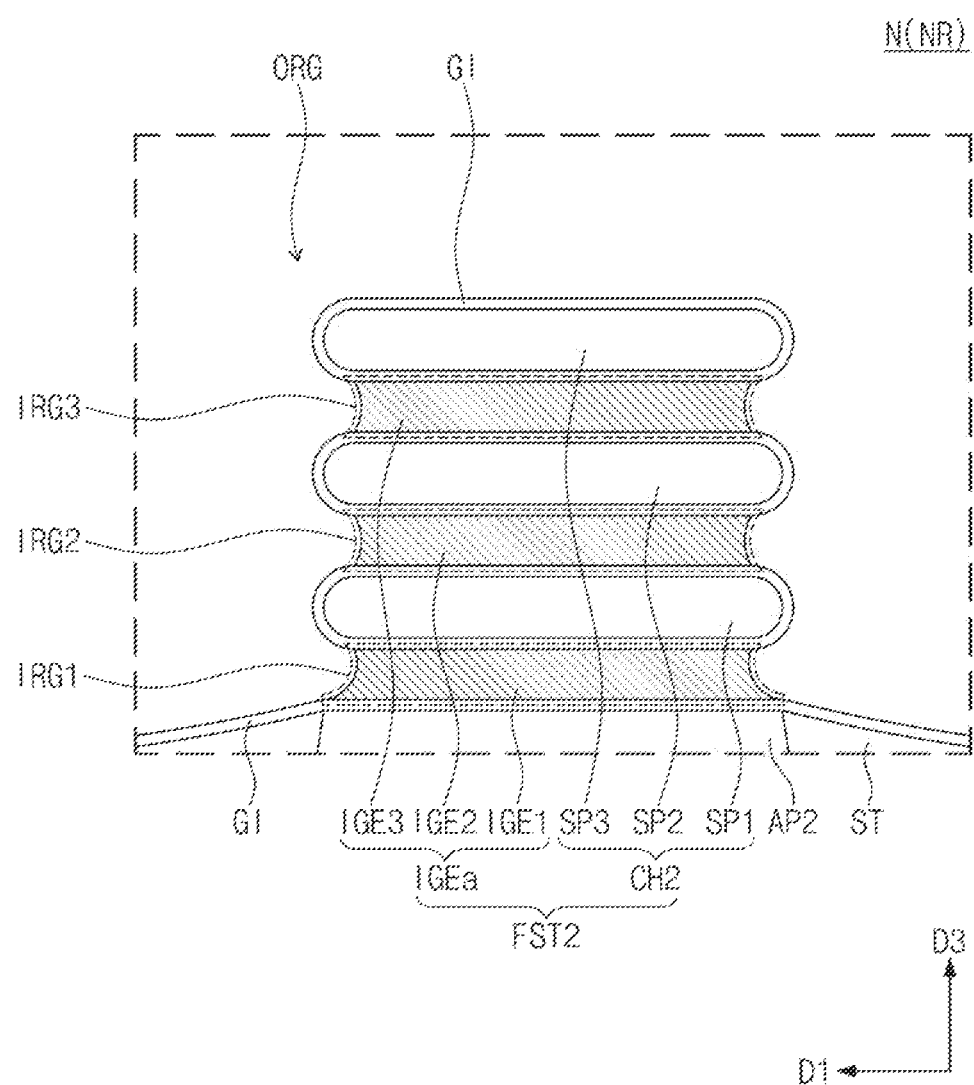

Referring to FIGS. 12A and 12B, an etching process may be performed in which the first metal layer MTL1 is selectively etched to form first, second, and third inner gate electrodes IGE1, IGE2, and IGE3 in the first, second, and third inner areas IRG1, IRG2, and IRG3, respectively.

The etching process may include one or both of dry and wet etching processes that selectively etch the first metal layer MTL1. The etching process may continue until the gate dielectric layer GI on the first, second, and third semiconductor patterns SP1, SP2, and SP3 is exposed. The etching process may be performed such that the first metal layer MTL1 may not be completely removed, but may remain in the first, second, and third inner areas IRG1, IRG2, and IRG3.

The etching process may form, on the PMOSFET and NMOSFET regions PR and NR, inner gate electrodes IGEa that have the same material and structure.

Figure 13A:
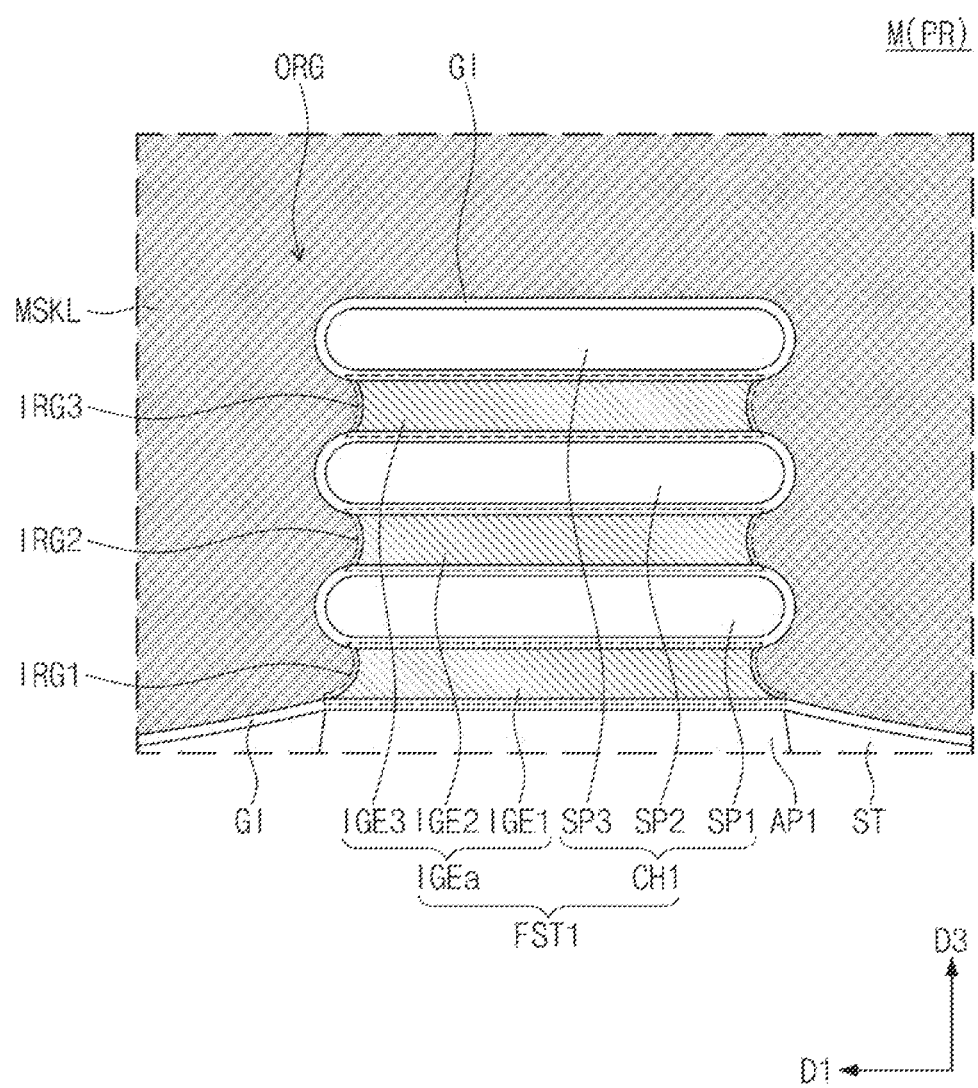
Figure 13B:
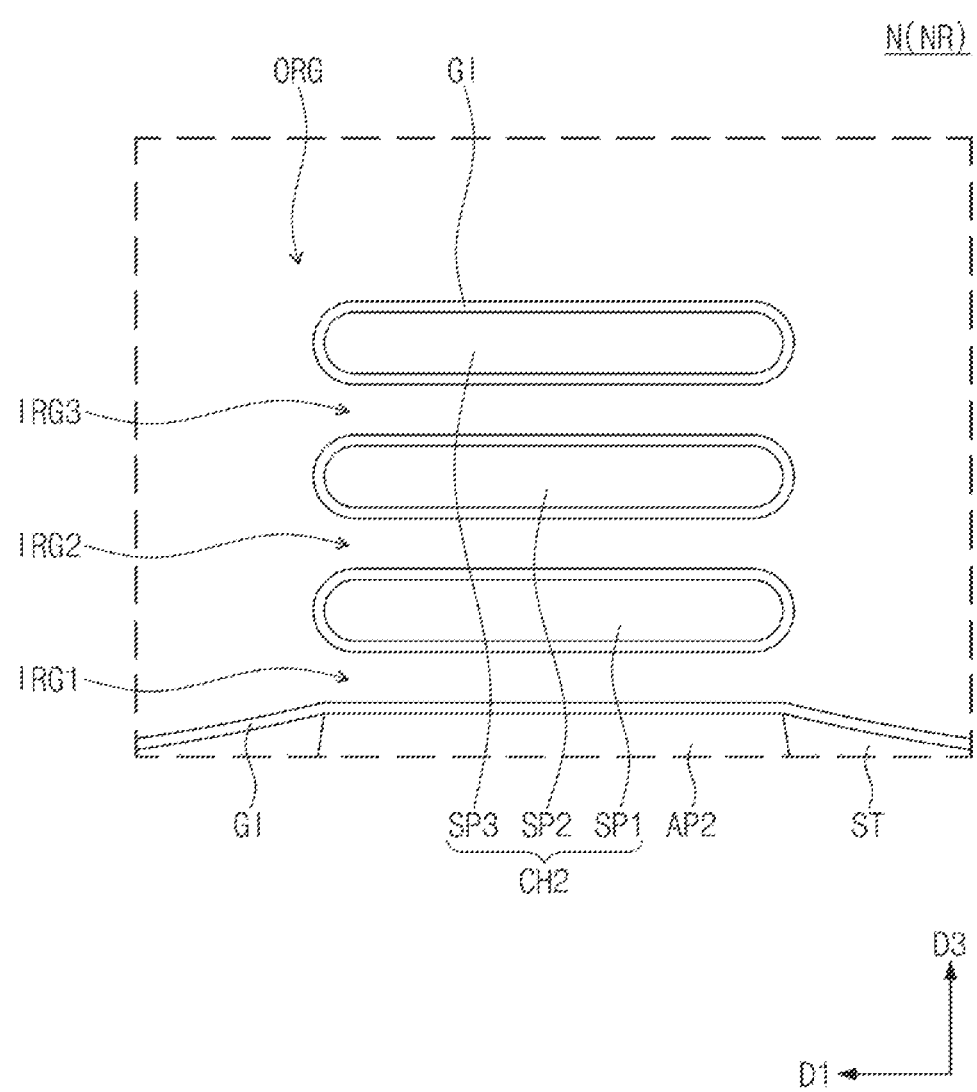

Referring to FIGS. 13A and 13B, a mask layer MSKL may be selectively formed only on the PMOSFET region PR. The mask layer MSKL may expose the NMOSFET region NR. The first, second, and third inner gate electrodes IGE1, IGE2, and IGE3 may be completely removed from the exposed NMOSFET region NR. The first, second, and third inner gate electrodes IGE1, IGE2, and IGE3 on the PMOSFET region PR may be protected by the mask layer MSKL and thus may not be removed. Subsequently, the mask layer MSKL may be selectively removed.

Figure 14A:
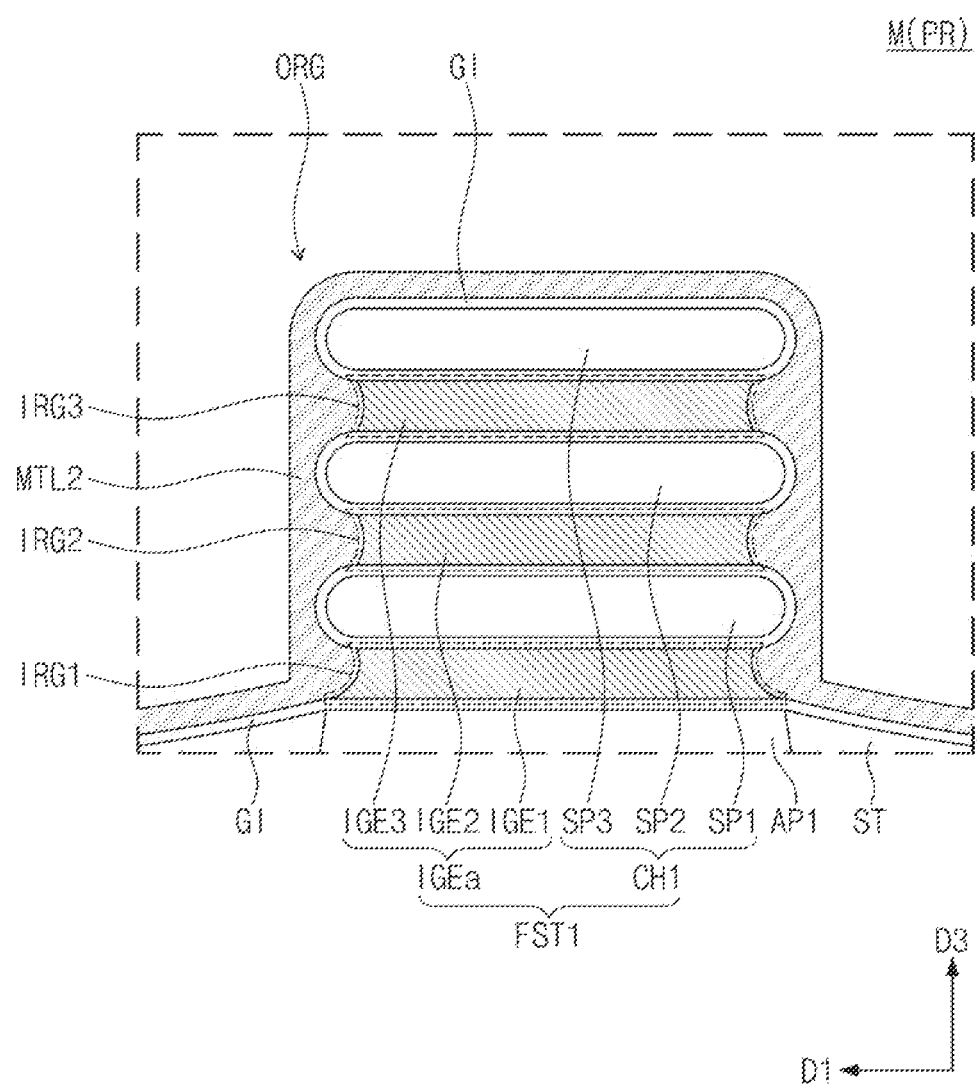
Figure 14B:
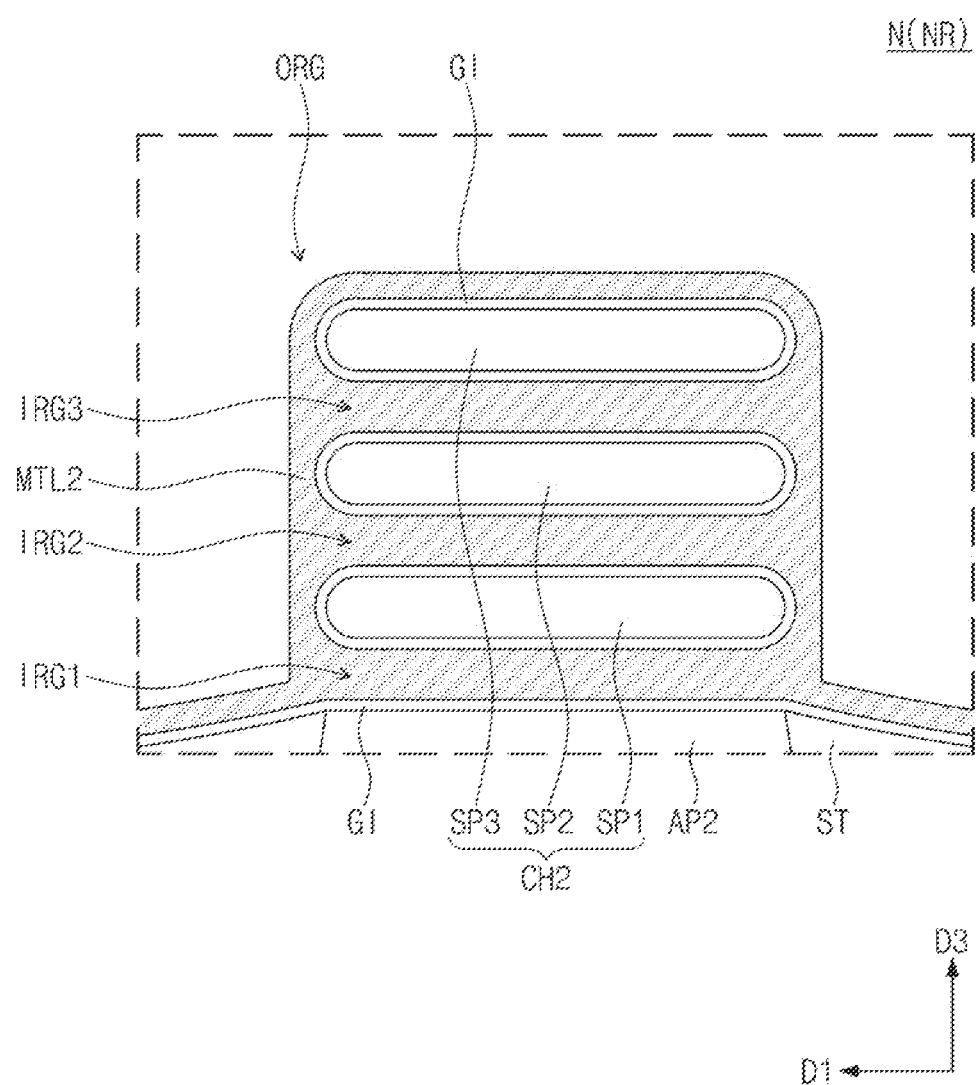

Referring to FIGS. 14A and 14B, a second metal layer MTL2 may be formed in common on the first channel pattern CH1 and the second channel pattern CH2. The second metal layer MTL2 may be formed to completely fill the first, second, and third inner areas IRG1, IRG2, and IRG3 on the NMOSFET region NR. Because the inner gate electrode IGEa already fills the first, second, and third inner areas IRG1, IRG2, and IRG3 on the PMOSFET region PR, the second metal layer MTL2 may not completely fill the first, second, and third inner areas IRG1, IRG2, and IRG3 on the PMOSFET region PR.

The second metal layer MTL2 may include a third workfunction metal. The second metal layer MTL2 may have a work function less than that of the first metal layer MTL1. The second metal layer MTL2 may include nitrogen (N) and at least one metal selected from titanium (Ti), tantalum (Ta), aluminum (Al), tungsten (W), and molybdenum (Mo). The first and second metal layers MTL1 and MTL2 may be different from each other in terms of one or more of material and composition.

Figure 15A:
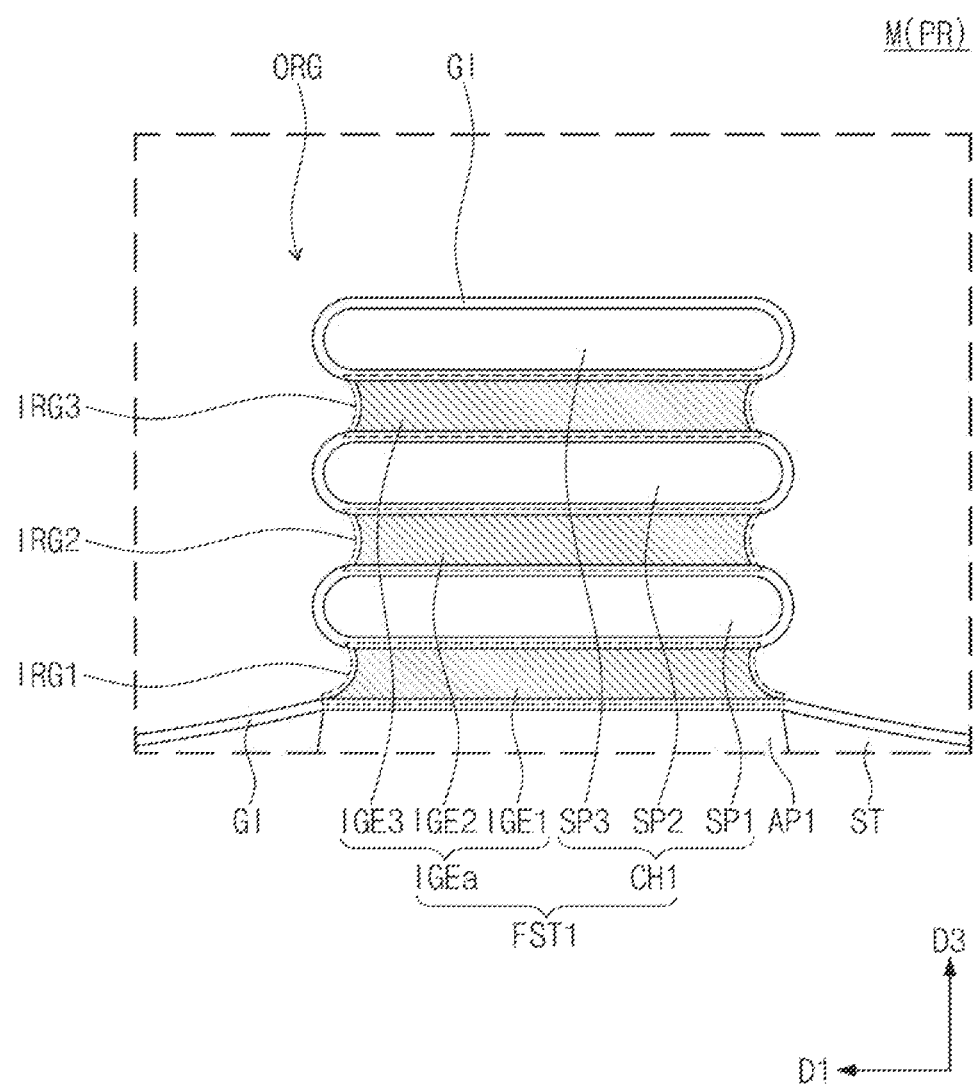
Figure 15B:
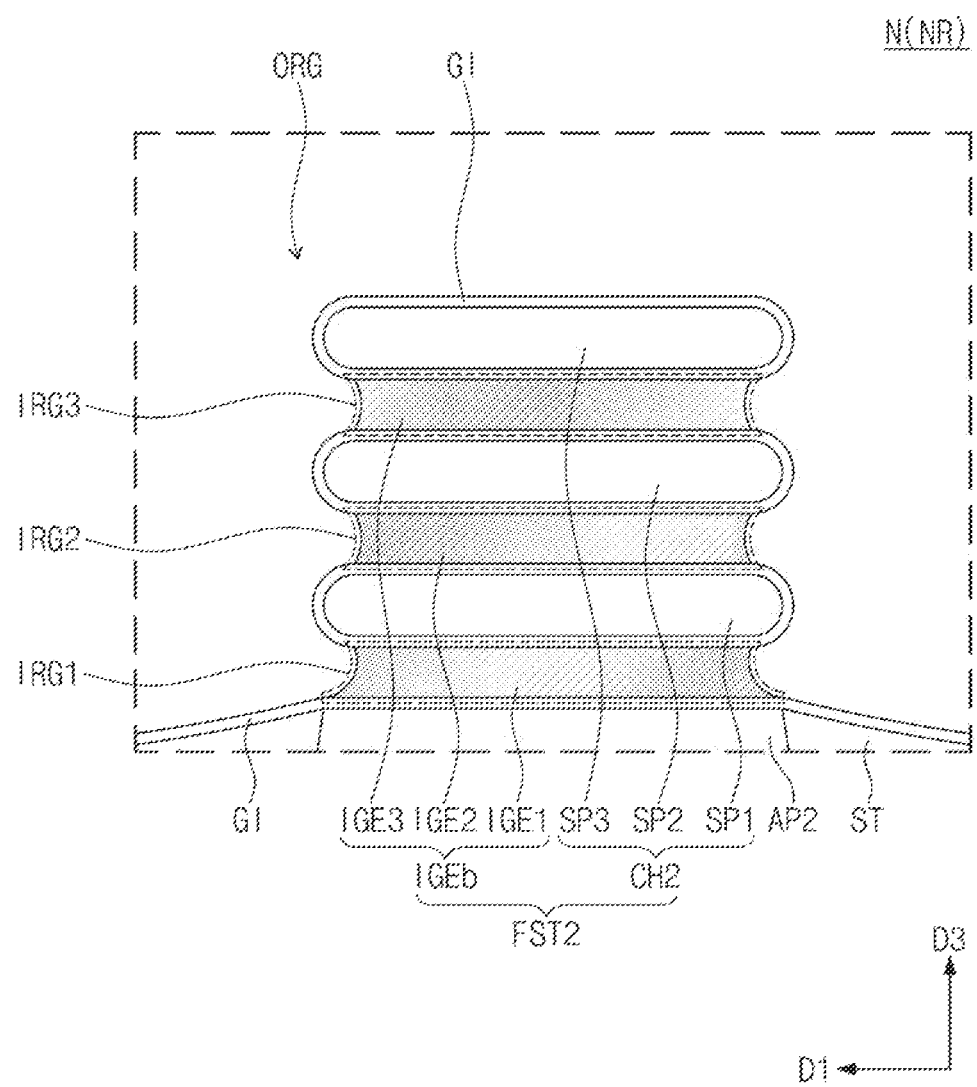

Referring to FIGS. 15A and 15B, an etching process may be performed in which the second metal layer MTL2 is selectively etched to respectively form the first, second, and third inner gate electrodes IGE1, IGE2, and IGE3 in the first, second, and third inner areas IRG1, IRG2, and IRG3 on the NMOSFET region NR.

The etching process may include one or both of dry and wet etching processes that selectively etch the second metal layer MTL2. The etching process may continue until the gate dielectric layer GI on the first, second, and third semiconductor patterns SP1, SP2, and SP3 is exposed. The etching process may be performed such that the second metal layer MTL2 may not be completely removed, but may remain in the first, second, and third inner areas IRG1, IRG2, and IRG3 on the NMOSFET region NR.

The etching process may completely remove the second metal layer MTL2 on the PMOSFET region PR. Therefore, the inner gate electrode IGEa including a first work-function metal may remain on the PMOSFET region PR, and an inner gate electrode IGEb including a third work-function metal may remain on the NMOSFET region NR. For example, the inner gate electrode IGEa on the PMOSFET region PR may be formed to have a work function different from that of the inner gate electrode IGEb on the NMOSFET region NR.

A first fin structure FST1 may be constituted by the first channel pattern CH1 and the inner gate electrode IGEa on the PMOSFET region PR. A second fin structure FST2 may be constituted by the second channel pattern CH2 and the inner gate electrode IGEb on the NMOSFET region NR.

Referring back to FIGS. 3A and 3B, an outer gate electrode OGE may be formed in the outer area ORG on the first and second fin structures FST1 and FST2. For example, a first metal pattern MP1 may be formed to conformally cover surfaces of the first and second fin structures FST1 and FST2. A second metal pattern MP2 may be formed on the first metal pattern MP1, and the second metal pattern MP2 may have a relatively large thickness. On the second metal pattern MP2, a fill metal pattern FMP may be formed to completely fill a remaining space of the outer area ORG.

According to an embodiment of the present inventive concepts, detailed processes for forming the outer gate electrode OGE may be performed identically on the PMOSFET and NMOSFET regions PR and NR.

Figure 16:
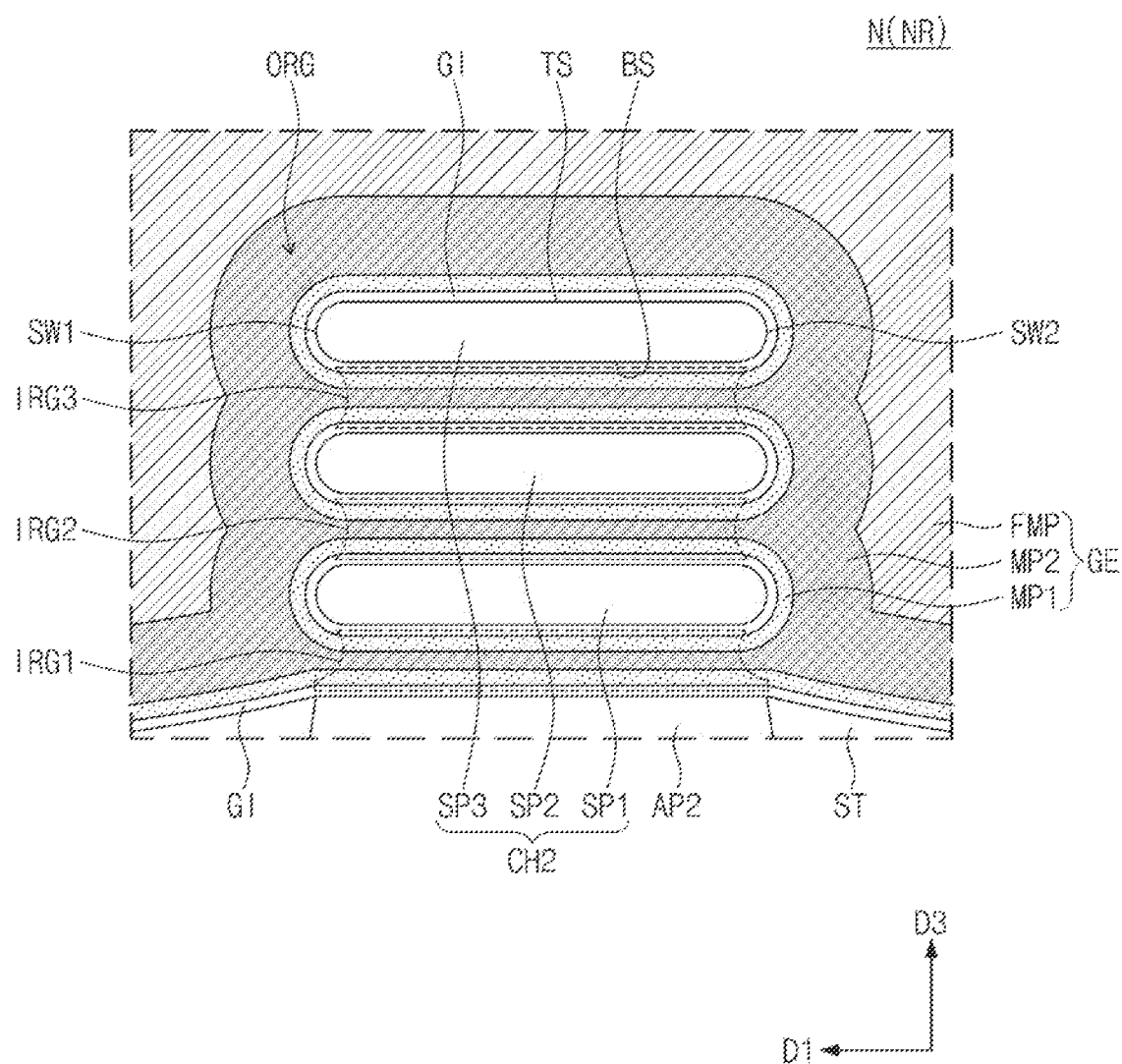
FIGS. 16, 17, and 18 illustrate cross-sectional views showing a semiconductor device, according to example embodiments of the present inventive concepts.
Figure 17:
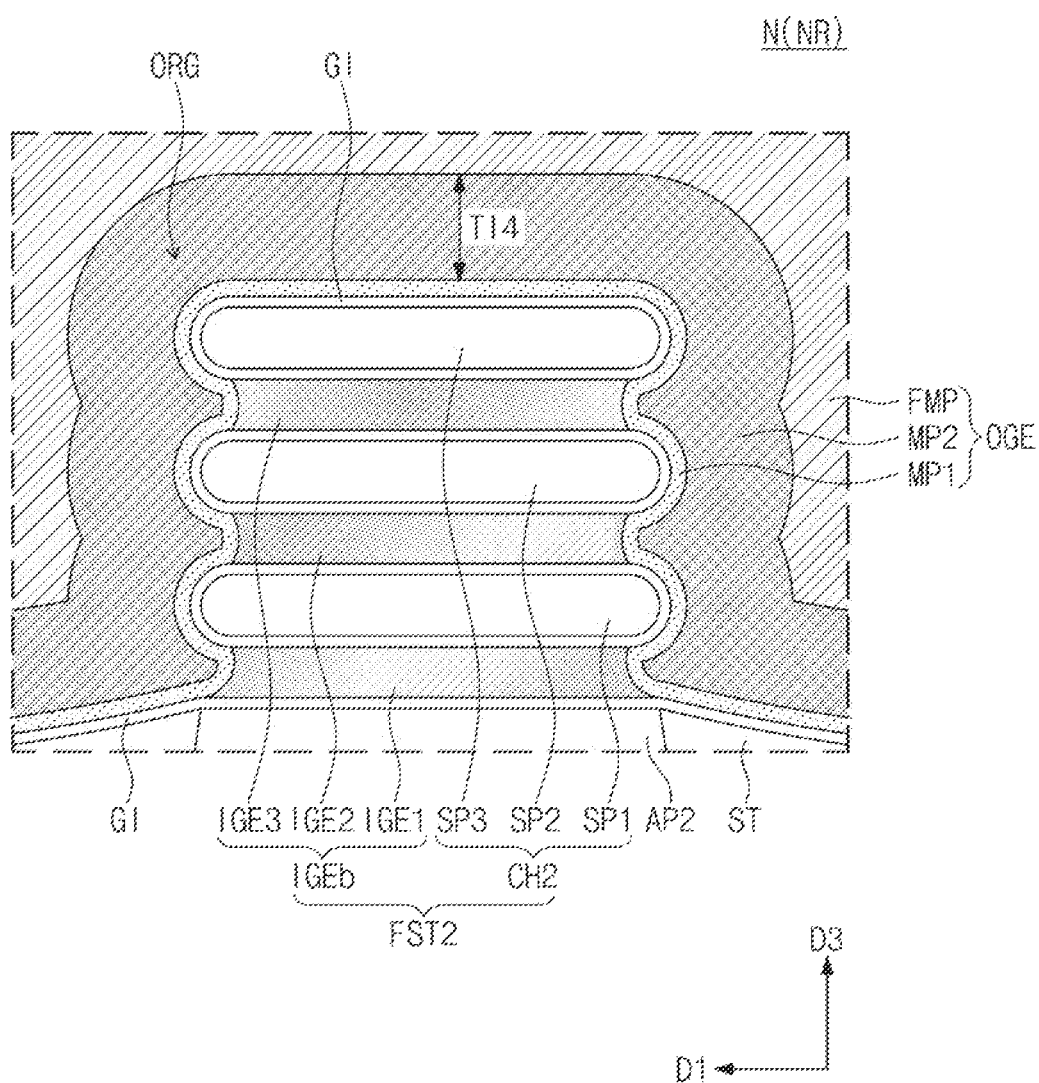
Figure 18:
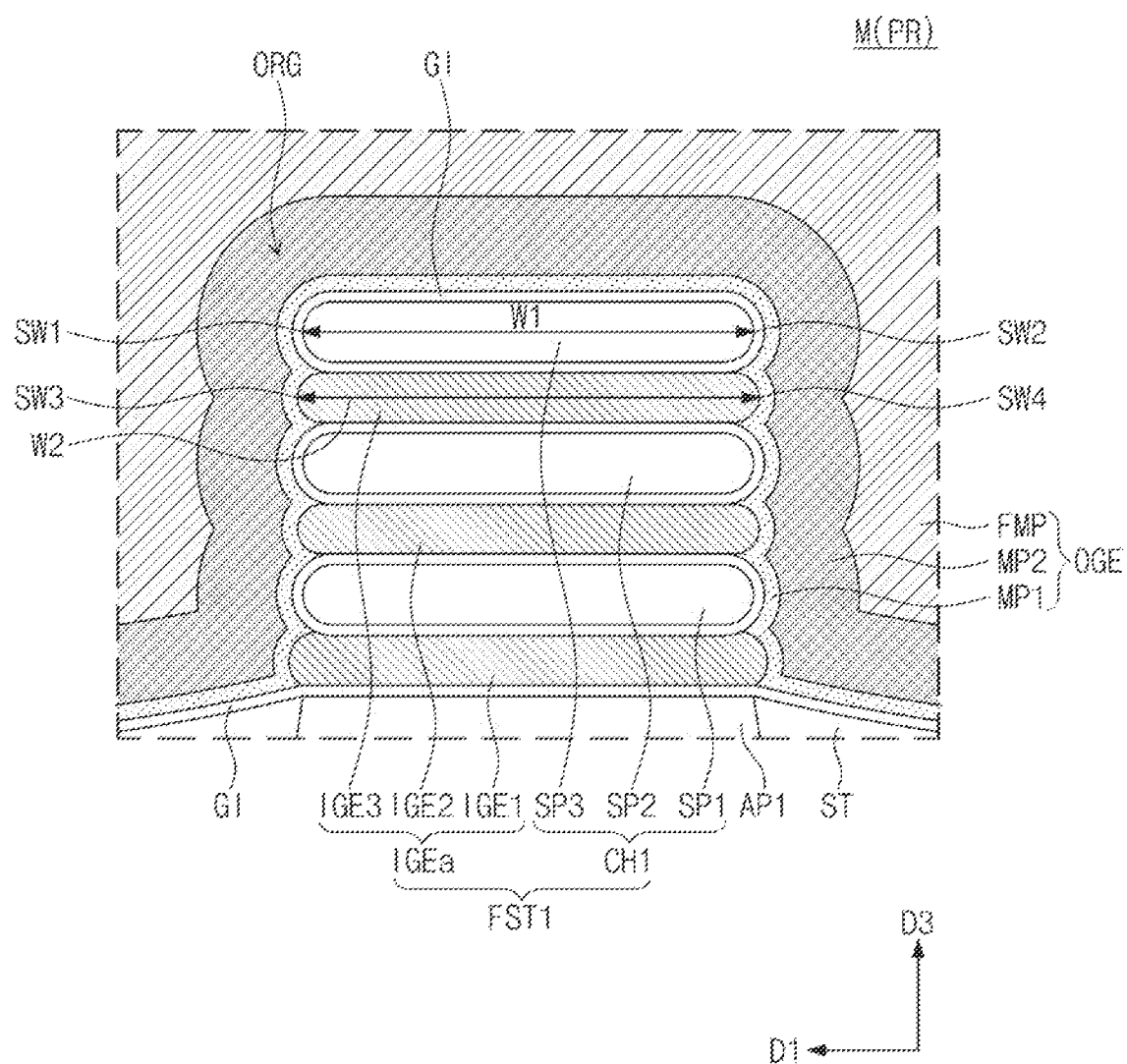

FIGS. 16, 17, and 18 illustrate cross-sectional views showing a semiconductor device according to some embodiments of the present inventive concepts. FIGS. 16 and 17 show enlarged cross-sectional views of section N depicted in FIG. 2D. FIG. 18 shows an enlarged cross-sectional view of section M depicted in FIG. 2D. In the embodiment that follows, a detailed description of technical features repetitive to those discussed above with reference to FIGS. 1, 2A to 2D, 3A, and 3B will be omitted, and a difference thereof will be discussed in detail.

Referring to FIG. 16, the inner gate electrode IGEb may be omitted from the gate electrode GE on the NMOSFET region NR. The gate electrode GE may include a first metal pattern MP1, a second metal pattern MP2, and a fill metal pattern FMP.

The first metal pattern MP1 and the second metal pattern MP2 may be provided in each of the first, second, and third inner areas IRG1, IRG2, and IRG3. The first metal pattern MP1 may surround each of the first, second, and third semiconductor patterns SP1, SP2, and SP3. For example, the first metal pattern MP1 may be provided on a top surface TS, opposite sidewalls SW1 and SW2, and a bottom surface BS of the third semiconductor pattern SP3. The second metal pattern MP2 may fill remaining portion of each of the first, second, and third inner areas IRG1, IRG2, and IRG3 in each of which the first metal pattern MP1 fills.

The gate electrode GE on the PMOSFET region PR may include, as discussed above in FIG. 3A, the inner gate electrode IGEa and the outer gate electrode OGE. For example, the gate electrode GE on the PMOSFET region PR may have a different configuration from that of the gate electrode GE on the NMOSFET region NR.

Referring to FIG. 17, on the NMOSFET region NR, the second metal pattern MP2 of the outer gate electrode OGE may have a fourth thickness TI4. As discussed in FIG. 3A, the second metal pattern MP2 on the PMOSFET region PR may have the third thickness TI3. According to the present embodiment, the fourth thickness TI4 may be different from the third thickness TI3. For example, the fourth thickness TI4 may be greater than the third thickness TI3.

Although not shown, the first metal pattern MP1 on the NMOSFET region NR may have a thickness different from that of the first metal pattern MP1 on the PMOSFET region PR. According to the present embodiment, at least one selected from the first and second metal patterns MP1 and MP2 in the outer gate electrode OGE may have different thicknesses on the PMOSFET region PR and the NMOSFET region NR, and thus PMOS and NMOS field effect transistors may be adjusted to have their work functions that are different from each other.

Referring to FIG. 18, at least one selected from the first, second, and third inner gate electrodes IGE1, IGE2, and IGE3 may have a sidewall that protrudes toward the outer gate electrode OGE. In some embodiments, each of the third and fourth sidewalls SW3 and SW4 of the third inner gate electrode IGE3 may convexly protrude in a horizontal direction. For example, the third sidewall SW3 of the third inner gate electrode IGE3 may horizontally protrude more than the first sidewall SW1 of the third semiconductor pattern SP3. The fourth sidewall SW4 of the third inner gate electrode IGE3 may horizontally protrude more than the second sidewall SW2 of the third semiconductor pattern SP3. The third semiconductor pattern SP3 may have a first width W1 in the first direction D1, and the third inner gate electrode IGE3 may have a second width W2 in the first direction D1 greater than the first width W1 in the first direction D1.

A semiconductor device according to the present inventive concepts may be configured such that an inner gate electrode may be provided between semiconductor patterns, and that a material and composition of the inner gate electrode may be adjusted to easily achieve a desired work function and a desired threshold voltage. For example, the inner gate electrode of a PMOS field effect transistor may be adjusted to have a work function different from that of the inner gate electrode of an NMOS field effect transistor, and accordingly the PMOS and NMOS field effect transistors may be controlled to have their own proper work function even the PMOS and NMOS field effect transistors share the same outer gate electrode. As a result, according to the present inventive concepts, it may be possible to increase device reliability and to decrease process difficulty in fabricating the semiconductor device.

Although some embodiments of the present inventive concepts have been discussed with reference to accompanying figures, it will be understood that various changes in form and details may be made therein without departing from the spirit and scope of the present inventive concepts. It therefore will be understood that the embodiments described above are just illustrative but not limitative in all aspects.

What is claimed is:

1. A semiconductor device, comprising:
    a first active pattern and a second active pattern respectively on a PMOSFET region and an NMOSFET region of a substrate;
    a first channel pattern on the first active pattern, the first channel pattern including a plurality of first semiconductor patterns that are stacked and spaced apart from each other in a vertical direction perpendicular to a top surface of the substrate;
    a second channel pattern on the second active pattern, the second channel pattern including a plurality of second semiconductor patterns that are stacked and spaced apart from each other in the vertical direction;
    a gate electrode on the first and second channel patterns, the gate electrode extending lengthwise in a first direction parallel to the top surface of the substrate; and
    a gate dielectric layer between the gate electrode and the first and second channel patterns,
    wherein the gate electrode includes:
        a first inner gate electrode that fills a first inner area between first semiconductor patterns of the plurality of first semiconductor patterns that are adjacent to each other;
        a second inner gate electrode that fills a second inner area between second semiconductor patterns of the plurality of second semiconductor patterns that are adjacent to each other; and
        an outer gate electrode that fills an outer area outside the first and second semiconductor patterns,
    wherein the first inner gate electrode is on a bottom surface of an uppermost one of the first semiconductor patterns,
    wherein the outer gate electrode is on a top surface and opposite sidewalls of the uppermost one of the first semiconductor patterns,
    wherein the second inner gate electrode is on a bottom surface of an uppermost one of the second semiconductor patterns,
    wherein the outer gate electrode is on a top surface and opposite sidewalls of the uppermost one of the second semiconductor patterns,
    wherein a work function of the first inner gate electrode is different from a work function of the second inner gate electrode,
    wherein each of the first and second inner gate electrodes includes aluminum-containing titanium nitride, and
    wherein an aluminum concentration in the first inner gate electrode is different from an aluminum concentration in the second inner gate electrode.

2. The semiconductor device of claim 1, wherein a width in the first direction of the first inner gate electrode is less than a width in the first direction of the uppermost one of the first semiconductor patterns.

3. The semiconductor device of claim 1,
    wherein the outer gate electrode includes:
        a first metal pattern;
        a second metal pattern on the first metal pattern; and
        a fill metal pattern on the second metal pattern, and
    wherein the first metal pattern covers opposite sidewalls of each of the first and second inner gate electrodes.

4. The semiconductor device of claim 3,
    wherein the first inner gate electrode on the bottom surface of the uppermost one of the first semiconductor patterns has a first thickness in the vertical direction,
    wherein the first metal pattern on the top surface of the uppermost one of the first semiconductor patterns has a second thickness in the vertical direction, and
    wherein the first thickness is about 2.5 times to about 10 times the second thickness.

5. The semiconductor device of claim 4,
    wherein the work function of the first inner gate electrode is greater than a work function of the second metal pattern, wherein the second metal pattern on the top surface of the uppermost one of the first semiconductor patterns has a third thickness in the vertical direction, and
wherein the third thickness is greater than the first thickness.

6. The semiconductor device of claim 3,
wherein the first inner gate electrode includes metal nitride, and
wherein the second metal pattern includes one of metal carbide and metal nitride, each of which is doped with at least one selected from silicon and aluminum.

7. The semiconductor device of claim 3,
wherein a component and a thickness of the first metal pattern on the PMOSFET region is substantially the same as a component and a thickness of the first metal pattern on the NMOSFET region, and
wherein a component and a thickness of the second metal pattern on the PMOSFET region is substantially the same as a component and a thickness of the second metal pattern on the NMOSFET region.

8. The semiconductor device of claim 1,
wherein the first inner gate electrode includes at least one impurity selected from silicon (Si), aluminum (Al), carbon (C), and nitrogen (N), and
wherein an impurity concentration decreases and then increases in a direction extending from a first sidewall of the first inner gate electrode to a second sidewall of the first inner gate electrode.

9. The semiconductor device of claim 1,
wherein the gate dielectric layer on the PMOSFET region is between the uppermost one of the first semiconductor patterns and the first inner gate electrode and between the uppermost one of the first semiconductor patterns and the outer gate electrode, and
wherein the gate dielectric layer on the NMOSFET region is between the uppermost one of the second semiconductor patterns and the second inner gate electrode and between the uppermost one of the second semiconductor patterns and the outer gate electrode.

10. A semiconductor device, comprising:
a substrate;
a device isolation layer on the substrate, the device isolation layer defining an active pattern;
a fin structure on the active pattern, the fin structure including a plurality of inner gate electrodes and a plurality of semiconductor patterns that are alternately stacked on the active pattern, the fin structure vertically protruding upwardly from the device isolation layer; and
an outer gate electrode on the fin structure,
wherein the outer gate electrode is on a top surface and opposite sidewalls of an uppermost one of the semiconductor patterns,
where an uppermost one of the inner gate electrodes is on a bottom surface of the uppermost one of the semiconductor patterns,
wherein a first sidewall and a second sidewall of the uppermost one of the inner gate electrodes are in contact with the outer gate electrode, the first and second sidewalls being opposite to each other,
wherein the uppermost one of the inner gate electrodes includes at least one impurity selected from silicon (Si), aluminum (Al), carbon (C), and nitrogen (N), and
wherein an impurity concentration in the uppermost one of the inner gate electrodes decreases and then increases in a direction extending from the first sidewall to the second sidewall.

11. The semiconductor device of claim 10, wherein the at least one impurity is derived from the outer gate electrode.

12. The semiconductor device of claim 10,
wherein the semiconductor patterns include a first semiconductor pattern, a second semiconductor pattern, and a third semiconductor pattern that are stacked and spaced apart from each other on the active pattern, and
wherein the inner gate electrodes include:
a first inner gate electrode between the active pattern and the first semiconductor pattern;
a second inner gate electrode between the first semiconductor pattern and the second semiconductor pattern; and
a third inner gate electrode between the second semiconductor pattern and the third semiconductor pattern.

13. The semiconductor device of claim 10,
wherein at least one selected from the first and second sidewalls of the uppermost one of the inner gate electrodes is recessed toward a center of the uppermost one of the inner gate electrodes, and
wherein a width of the uppermost one of the inner gate electrodes is less than a width of the uppermost one of the semiconductor patterns.

14. The semiconductor device of claim 10,
wherein the outer gate electrode includes:
a first metal pattern;
a second metal pattern on the first metal pattern; and
a fill metal pattern on the second metal pattern,
wherein the first metal pattern covers the first and second sidewalls of the uppermost one of the inner gate electrodes,
wherein the uppermost one of the inner gate electrodes on the bottom surface of the uppermost one of the semiconductor patterns has a first thickness in a vertical direction perpendicular to a top surface of the substrate,
wherein the first metal pattern on the top surface of the uppermost one of the semiconductor patterns has a second thickness in the vertical direction, and
wherein the first thickness is about 2.5 times to about 10 times the second thickness.

15. A semiconductor device, comprising:
a first active pattern and a second active pattern respectively on a PMOSFET region and an NMOSFET region of a substrate;
a device isolation layer that fills a trench between the first and second active patterns;
a first fin structure on the first active pattern, the first fin structure including a plurality of first inner gate electrodes and a plurality of first semiconductor patterns that are alternately stacked on the first active pattern;
a second fin structure on the second active pattern, the second fin structure including a plurality of second inner gate electrodes and a plurality of second semiconductor patterns that are alternately stacked on the second active pattern;
a gate dielectric layer that surrounds each of the first and second semiconductor patterns;
an outer gate electrode that covers the first and second fin structures and extends lengthwise in a first direction parallel to a top surface of the substrate;
a gate capping pattern on a top surface of the outer gate electrode;
a first interlayer dielectric layer on the gate capping pattern;
a gate contact that penetrates the first interlayer dielectric layer and is coupled to the outer gate electrode;

a second interlayer dielectric layer on the first interlayer dielectric layer;
a first metal layer in the second interlayer dielectric layer, the first metal layer including a first line electrically connected to the gate contact;
a third interlayer dielectric layer on the second interlayer dielectric layer; and
a second metal layer in the third interlayer dielectric layer,
wherein the second metal layer includes a second line electrically connected to the first line,
wherein an uppermost one of the first inner gate electrodes is on a bottom surface of an uppermost one of the first semiconductor patterns,
wherein the outer gate electrode is on a top surface and opposite sidewalls of the uppermost one of the first semiconductor patterns,
wherein an uppermost one of the second inner gate electrodes is on a bottom surface of an uppermost one of the second semiconductor patterns,
wherein the outer gate electrode is on a top surface and opposite sidewalls of the uppermost one of the second semiconductor patterns,
wherein a work function of the first inner gate electrode is different from a work function of the second inner gate electrode,
wherein each of the first and second inner gate electrodes includes aluminum-containing titanium nitride, and
wherein an aluminum concentration in the first inner gate electrode is different from an aluminum concentration in the second inner gate electrode.

16. The semiconductor device of claim 15,
wherein a width in the first direction of the uppermost one of the first inner gate electrodes is less than a width in the first direction of the uppermost one of the first semiconductor patterns, and
wherein a width in the first direction of the uppermost one of the second inner gate electrodes is less than a width in the first direction of the uppermost one of the second semiconductor patterns.

17. The semiconductor device of claim 15,
wherein the outer gate electrode includes:
a first metal pattern;
a second metal pattern on the first metal pattern; and
a fill metal pattern on the second metal pattern,
wherein the first metal pattern covers opposite sidewalls of each of the first inner gate electrodes, and
wherein the first metal pattern covers opposite sidewalls of each of the second inner gate electrodes.

18. The semiconductor device of claim 17,
wherein the uppermost one of the first inner gate electrodes has a first thickness in a vertical direction perpendicular to the top surface of the substrate,
wherein the first metal pattern on the top surface of the uppermost one of the first semiconductor patterns has a second thickness in the vertical direction, and
wherein the first thickness is about 2.5 times to about 10 times the second thickness.

* * * * *